United States Patent
Shen et al.

(10) Patent No.: US 11,145,592 B2
(45) Date of Patent: Oct. 12, 2021

(54) PROCESS FOR FORMING METAL-INSULATOR-METAL STRUCTURES

(71) Applicant: Taiwan Semiconductor Manufacturing Co., Ltd., Hsinchu (TW)

(72) Inventors: Hsiang-Ku Shen, Hsinchu (TW); Jian-Ming Huang, New Taipei (TW); Han-Yi Chen, Hsinchu (TW); Ecko Lu, Hsinchu (TW); Hsiang-Yu Tsai, Hsinchu (TW); Chih-Hung Lu, Hsinchu County (TW); Wen-Tung Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/787,933

(22) Filed: Feb. 11, 2020

(65) Prior Publication Data

US 2021/0249350 A1 Aug. 12, 2021

(51) Int. Cl.
*H01L 23/522* (2006.01)
*H01L 21/311* (2006.01)
*H01L 21/02* (2006.01)
*H01L 21/768* (2006.01)
*H01L 23/532* (2006.01)
(Continued)

(52) U.S. Cl.
CPC ...... *H01L 23/5223* (2013.01); *H01L 21/0217* (2013.01); *H01L 21/02164* (2013.01); *H01L 21/31116* (2013.01); *H01L 21/76804* (2013.01); *H01L 21/76805* (2013.01); *H01L 21/76843* (2013.01); *H01L 21/76877* (2013.01); *H01L 23/5226* (2013.01); *H01L 23/5283* (2013.01); *H01L 23/53223* (2013.01); *H01L 23/53238* (2013.01); *H01L 28/60* (2013.01); *H01L 21/02178* (2013.01); *H01L 21/02181* (2013.01);
(Continued)

(58) Field of Classification Search
CPC .. H01L 28/60; H01L 27/224; H01L 21/31116; H01L 23/5223
See application file for complete search history.

(56) References Cited

U.S. PATENT DOCUMENTS 9,000,584 B2  4/2015  Lin et al.
9,048,222 B2  6/2015  Hung et al.
(Continued)

*Primary Examiner* — Zandra V Smith
*Assistant Examiner* — John M Parker
(74) *Attorney, Agent, or Firm* — Haynes and Boone, LLP

(57) ABSTRACT

Semiconductor devices and methods of forming the same are provided. A method according to an embodiment includes receiving a substrate including a lower contact feature, depositing a first dielectric layer over a substrate, forming a metal-insulator-metal (MIM) structure over the first dielectric layer, depositing a second dielectric layer over the MIM structure, performing a first etch process to form an opening that extends through the second dielectric layer to expose the MIM structure, performing a second etch process to extend the opening through the MIM structure to expose the first dielectric layer; and performing a third etch process to further extend the opening through the first dielectric layer to expose the lower contact feature. Etchants of the first etch process and the third etch process include fluorine while the etchant of the second etch process is free of fluorine.

20 Claims, 22 Drawing Sheets

(51) Int. Cl.
*H01L 23/528* (2006.01)
*H01L 49/02* (2006.01)

(52) U.S. Cl.
CPC .. *H01L 21/02183* (2013.01); *H01L 21/02186* (2013.01); *H01L 21/02189* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2016/0099302 A1* | 4/2016 | Seidel .................... H01L 28/40 257/532 |
| 2020/0006183 A1 | 1/2020 | Huang |
| 2020/0035779 A1* | 1/2020 | Huang .............. H01L 21/32131 |

\* cited by examiner

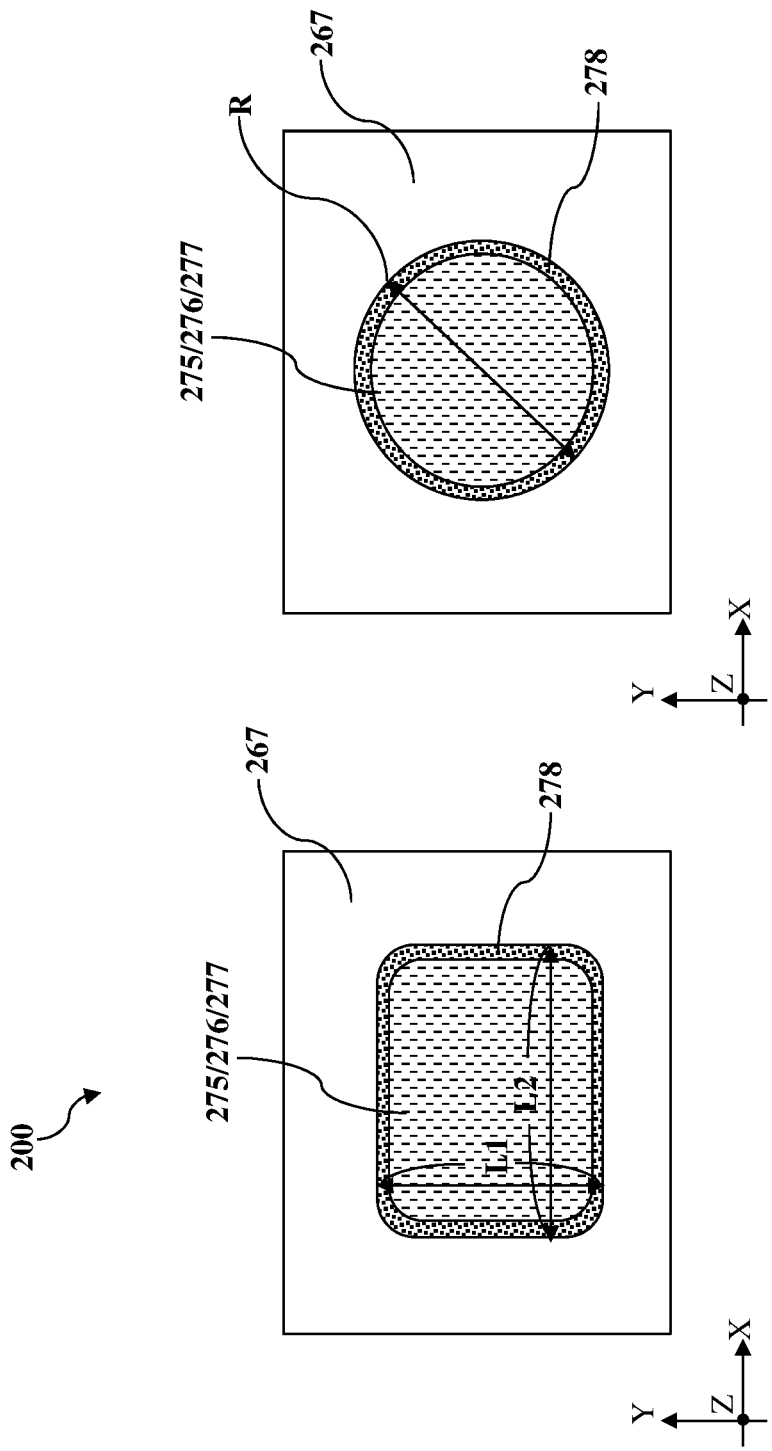

PROCESS FOR FORMING METAL-INSULATOR-METAL STRUCTURES

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

As the geometry size of IC devices decreases, passive devices that require large surface areas are moved to back-end-of-line (BEOL) structures. Metal-Insulator-Metal (MIM) capacitors are among examples of such passive devices. A typical MIM capacitor includes multiple conductor plate layers that are insulated from one another by multiple insulator layers. Contact vias are formed through an MIM capacitor. Some contact vias penetrate the conductor plate layers without electrically coupling to any of them, some contact vias are electrically coupled to a subset of the conductor plate layers, and some contact vias are electrically couple to a different subset of the conductor plate layers. The formation of the contact vias requires forming an opening through the MIM capacitor as well as dielectric layers overlying and underlying the MIM capacitor. One or more non-volatile insulative byproducts may be produced when etching the conductor plate layers, resulting a stepped structure and increased contact resistance. Therefore, although existing MIM structures and the fabrication process thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 22A and 22B are fragmentary top views of upper contact features through conductor plate layers in an MIM structure in accordance with embodiments of the present disclosure.

DETAILED DESCRIPTION

Figure 1:
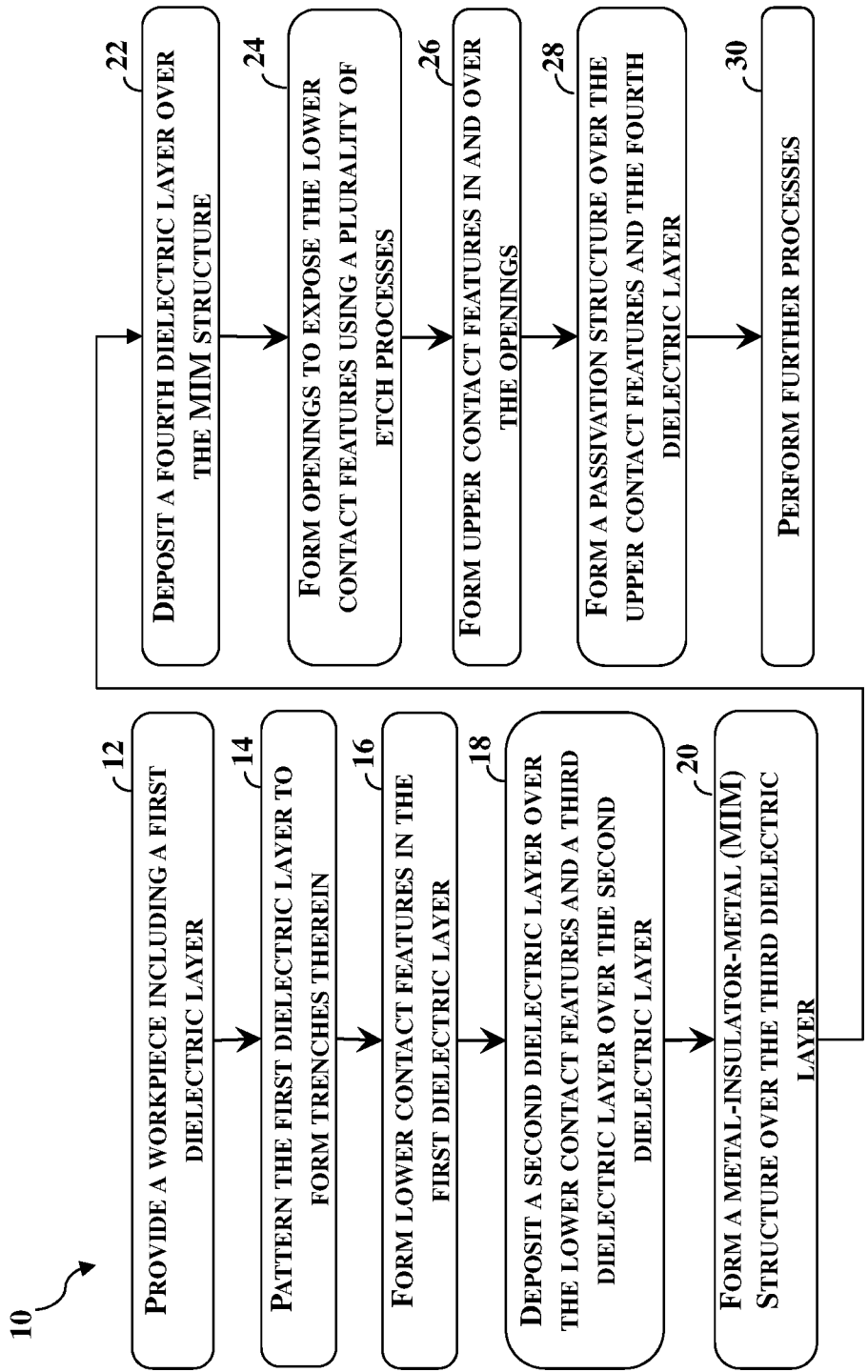
FIG. 1 is a flow chart of a method for fabricating a semiconductor device in accordance with embodiments of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments, in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Metal-Insulator-Metal (MIM) capacitors have been widely used in functional circuits such as mixed signal circuits, analog circuits, Radio Frequency (RF) circuits, Dynamic Random Access Memories (DRAMs), embedded DRAMs, and logic operation circuits. In system-on-chip (SOC) applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. As its name suggests, an MIM capacitor includes a sandwich structure of interleaving metal layers and insulator layers. An example MIM capacitor includes a bottom conductor plate layer, a middle conductor plate layer over the bottom conductor plate layer, and a top conductor plate layer over the middle conductor plate, each of which is insulated from an adjacent conductor plate layer by an insulator layer. As an MIM capacitor is fabricated in a BEOL structure to have a larger surface area, its conductor plate layers extend over multiple lower contact features. Contact vias may be formed through the conductor plate layers to electrically couple the lower contact features to upper contact features, such as contact pads, for connection to external circuitry.

Contact vias may penetrate the conductor plate layers at least three scenarios. In the first scenario, a contact via extends through the conductor plate layers without electrically coupling to any of the conductor plate layers. The contact via in the first scenario may be for logic drive signals and may be referred to as a logic contact via. In the second scenario, a contact via extends through the conductor plate layers and is only electrically coupled to the middle conductor plate layer. As the contact via in the second scenario is electrically coupled to the middle conductor plate layer but electrically isolated from the top conductor plate layer and the bottom conductor plate layer, it may be referred to a middle plate (MP) contact via. In the third scenario, a contact via extends through the conductor plate layers and is only electrically coupled to top conductor plate layer and the bottom conductor plate. As the contact via in the second scenario is electrically coupled to the top conductor plate layer and the bottom conductor plate layer but is insulated from the middle conductor plate layer, it may be referred to a top plate-bottom plate (TPBP) contact via. The logic conduct via has nothing to do with operations of the MIM capacitor. On the contrary, the MP contact via and the TPMP contact via provide access to capacitance between the middle conductor plate, on the one hand, and the top conductor plate layer and the bottom conductor plate layer, on the other hand.

The conductor plate layers are patterned to ensure proper electrical coupling to and insulation from the respective contact vias. As a logic contact via is to pass through the conductor plate layers without coupling to any of them, an opening in each of the conductor plate layers is formed such that the openings are vertically aligned to form a passage way for the logic contact via. As an MP contact via is to couple to the middle conductor plate layer and insulated from the top conductor plate layer and the bottom conductor plate layer, openings are form in the top conductor plate layer and the bottom conductor plate layer. With respect to an TPBP contact via that is insulated from the middle conductor plate layer, an opening is formed in the middle conductor plate layer. This opening is made larger than the via opening for the TPBP contact via.

As can be seen from the foregoing descriptions, the via openings may be formed through different number of conductor plate layers. Formation of a logic contact via does not require etching through all three conductor plate layers because vertically aligned openings in the conductor plate layers have already been made. Formation of an MP contact via requires etching through one conductor plate layer—the middle conductor plate layer. Formation of an TPBP contact via requires etching through two conductor plate layers—the top conductor plate layer and the bottom conductor plate layer. This creates uneven etch loading when the via openings are etched in the same etch process. That is, the etching through the via opening for the logic contact via sees no conductor plate layer, the etching through the via opening for the MP contact via sees one conductor plate layer, and the etching through the via opening for the TPBP contact via sees two conductor plate layers. To address this issue, dummy plates are used to even out the uneven etch loading. Two dummy plates may be inserted in the openings in the bottom conductor plate layer and the middle conductor plate layer, respectively. One dummy plate may be inserted in the top conductor plate layer at the location where the MPC contact via is formed. With the insertion of the dummy plates, formation of the logic contact via, the MP contact via, and the TPBP contact via all involves etching through two conductor layers.

Conventionally, fluorine-based etchants are used to etch through conductor plate layers as well as the overlying and underlying dielectric layers. For example, sulfur hexafluoride ($SF_6$) is used, according to some conventional etch processes, to etch through the conductor plate layers. It has been observed that when the conductor plate layers are formed of transition metals or transition metal nitride, such as a titanium (Ti), tantalum (Ta), titanium nitride (TiN), or tantalum nitride (TaN), the conventional etch processes may produce metal fluoride as byproducts (hereinafter "metal fluoride byproducts"). For example, the etching of titanium nitride conductor plate layers may produce titanium fluoride ($TF_x$, X=3 or 4). Metal fluoride byproducts are non-volatile and may not be removed during the etch process. As the conductor plate layers are being etched, such metal fluoride may be redeposited onto the newly etched surfaces and slows down the etch process. Oftentimes the redeposition of the metal fluoride may result in stepped sidewalls of the via openings because the redeposition is likely to take place when the etching process progresses toward lower conductor plate layers. In side views, contact vias formed using conventional processes may be characterized by a steep taper followed by a shallow taper as the contact vias penetrate the MIM capacitors. In addition, because metal fluoride byproducts have lower conductivity than the material of the conductor plate layers and etch slower than the material of the conductor plate layers, residual metal fluoride byproducts may remain at the interface between the conductor plate layers and the contact vias, resulting in increased contact resistance. Further still, the residual metal fluoride may be redeposited on the dielectric layer underlying the conductor plate layers to slow down the etching rate through the underlying dielectric layer, resulting in dishing of the underlying dielectric layer. The dishing of the underlying dielectric layer may lead to uneven etching through the etch stop layer that underlies the underlying dielectric layer. The presence or absence of residual metal fluoride byproduct at the interface may be observed or verified by energy-dispersive X-ray spectroscopy (EDX).

The present disclosure provides a method to prevent formation of metal fluoride byproducts and avoid the aforementioned increased contact resistance. The method of the present disclosure forms openings through the MIM structure (as well as overlying and underlying dielectric layers) using multiple etch processes. In some embodiments, a first etch process etches through the overlying dielectric layer using sulfur hexafluoride ($SF_6$), a second etch process etches through the MIM structure using chlorine, and then a third etch process etches through the underlying dielectric layer using carbon tetrafluoride ($CF_4$). Chlorine in the second etch process etches through the MIM structure and produces volatile metal chlorides that may be readily removed during the second etch process. Without producing non-volatile species that may slows down the etch process, methods of the present disclosure may form a contact via having a linear taper through the MIM structure. In addition, because metal chloride etch byproducts are readily removable, the contact resistance between a contact via and conductor plate layers is not impacted. Moreover, the volatile metal chloride does not cause dishing as the etch process progresses through layers underlying the MIM structure.

The various aspects of the present disclosure will now be described in more detail with reference to the figures. In that regard, FIG. 1 is a flowchart illustrating a method 10 for fabricating a semiconductor device according to embodiments of the present disclosure. Method 10 is merely an example and is not intended to limit the present disclosure to what is explicitly illustrated in method 10. Additional steps can be provided before, during, and after method 10, and some steps described can be replaced, eliminated, or moved around for additional embodiments of the method. Not all steps are described herein in detail for reasons of simplicity. Method 10 is described below in conjunction with FIGS. 2-20, which are diagrammatic fragmentary cross-sectional views of the semiconductor device at different stages of fabrication according to embodiments of the present disclosure.

Figure 2:
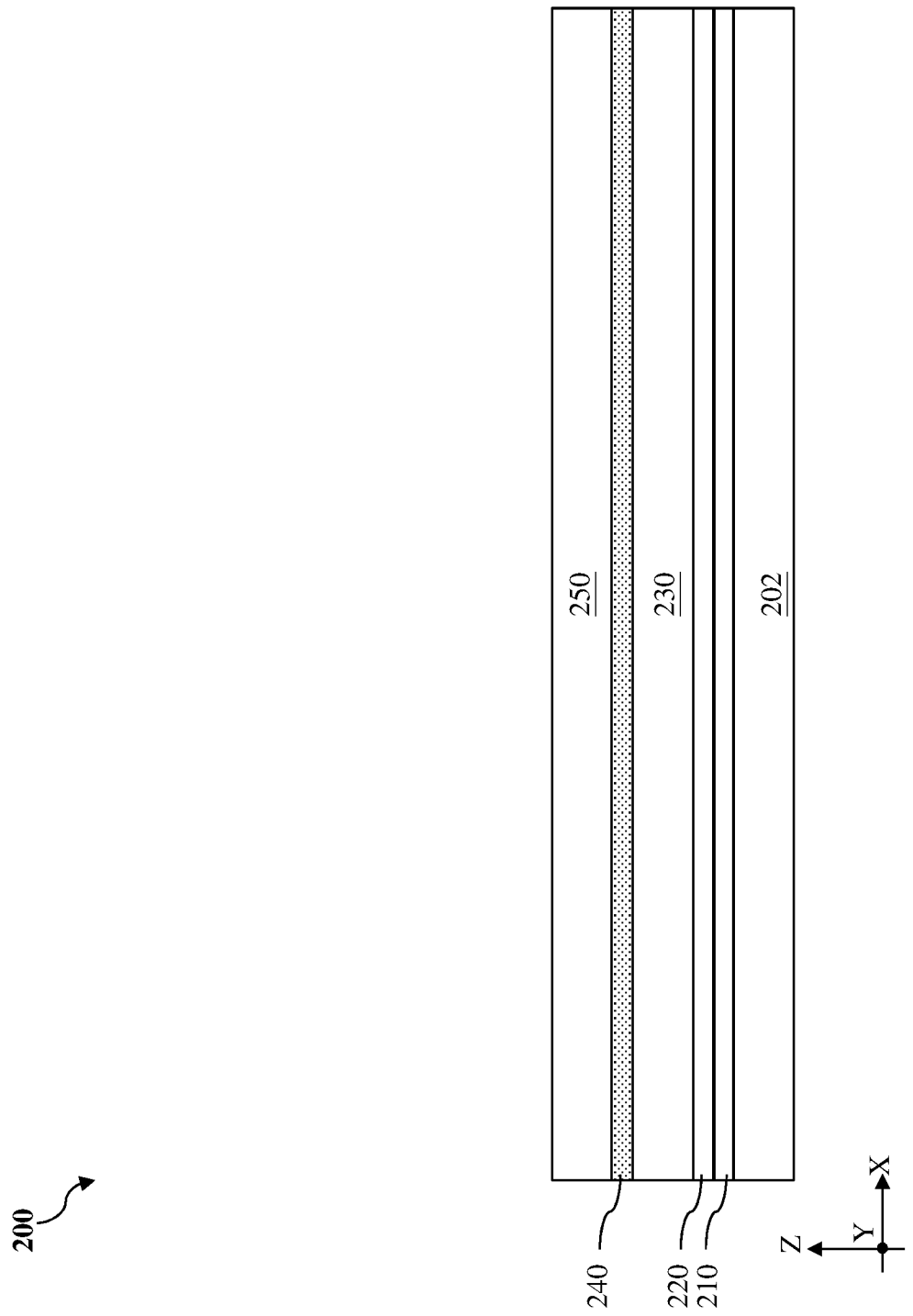
FIGS. 2-20 are cross-sectional views of a semiconductor device at various stages of fabrication according to embodiments of the present disclosure.

Referring to FIGS. 1 and 2, method 10 includes a block 12 where a workpiece 200 is provided. The workpiece 200 includes various layers already formed thereon. Because a semiconductor device will be formed from the workpiece 200, workpiece 200 may be referred to as semiconductor device 200 in suitable context. The workpiece 200 includes a substrate 202, which may be made of silicon or other semiconductor materials such as germanium. The substrate 202 also may include a compound semiconductor such as silicon carbide, gallium arsenic, indium arsenide, or indium phosphide. In some embodiments, the substrate 202 may include alloy semiconductor such as silicon germanium, silicon germanium carbide, gallium arsenic phosphide, or gallium indium phosphide. In some embodiments, the substrate 202 may include an epitaxial layer, for example an epitaxial layer overlying a bulk semiconductor. Various microelectronic components may be formed in or on the substrate 202, such as transistor components including source/drain features, gate structures, gate spacers, source/drain contacts, gate contacts, isolation structures including shallow trench isolation (STI), or any other suitable components.

The workpiece 200 also includes an interconnect layer 210. The interconnect layer 210 may be one of the interconnect layers in a multi-layered interconnect (MLI) structure, which is formed over the substrate 202 and may include multiple patterned dielectric layers and conductive layers that provide interconnections (e.g., wiring) between the various microelectronic components of the workpiece 200. There may be intermediate layers or components between the interconnect layer 210 and the substrate 202, but in the interest of simplicity such layers or components are not shown. In an embodiment, the interconnect layer 210 is about 169 to about 230 nanometers (nm) thick.

The interconnect layer 210 may include multiple conductive components as well as an interlayer dielectric (ILD) component that partially or fully surrounds the conductive components. The conductive components may include contacts, vias, or metal lines. The ILD component may be a silicon oxide or silicon oxide containing material where silicon exists in various suitable forms. As an example, the ILD component includes silicon oxide or a low-k dielectric material whose k-value (dielectric constant) is smaller than that of silicon oxide, which is about 4. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof.

In an embodiment, a carbide layer 220 is deposited on the interconnect layer 210. The deposition process includes chemical vapor deposition (CVD), physical vapor deposition (PVD), atomic layer deposition (ALD), or combinations thereof. In some embodiments, the carbide layer 220 has a generally uniform thickness of between about 45 nm and about 70 nm. Any suitable type of carbide material such as silicon carbide (SiC) can be used in the carbide layer 220.

In an embodiment, an oxide layer 230 is deposited on the carbide layer 220. Any suitable deposition process may be used, including CVD, PVD, ALD, or combinations thereof. In some embodiments, the oxide layer 230 includes undoped silicon oxide. In an embodiment, the interconnect layer 210, the carbide layer 220 and the oxide layer 230 may be replaced with one or more interconnect structures.

In an embodiment, an etch stop layer (ESL) 240 is deposited on the oxide layer 230. In some embodiments, the ESL 240 is about 45 to about 55 nm thick. The ESL 240 may include silicon carbonitride (SiCN), silicon oxycarbide (SiOC), silicon carbide (SiC), silicon oxycarbonitride (SiOCN), or silicon nitride (SiN), or combinations thereof.

A first dielectric layer 250 may be deposited on the etch stop layer 240. In some embodiments, the first dielectric layer 250 includes undoped silica glass (USG) or silicon oxide. In some embodiments, the first dielectric layer 250 is about 800 to about 1000 nm thick.

Figure 3:
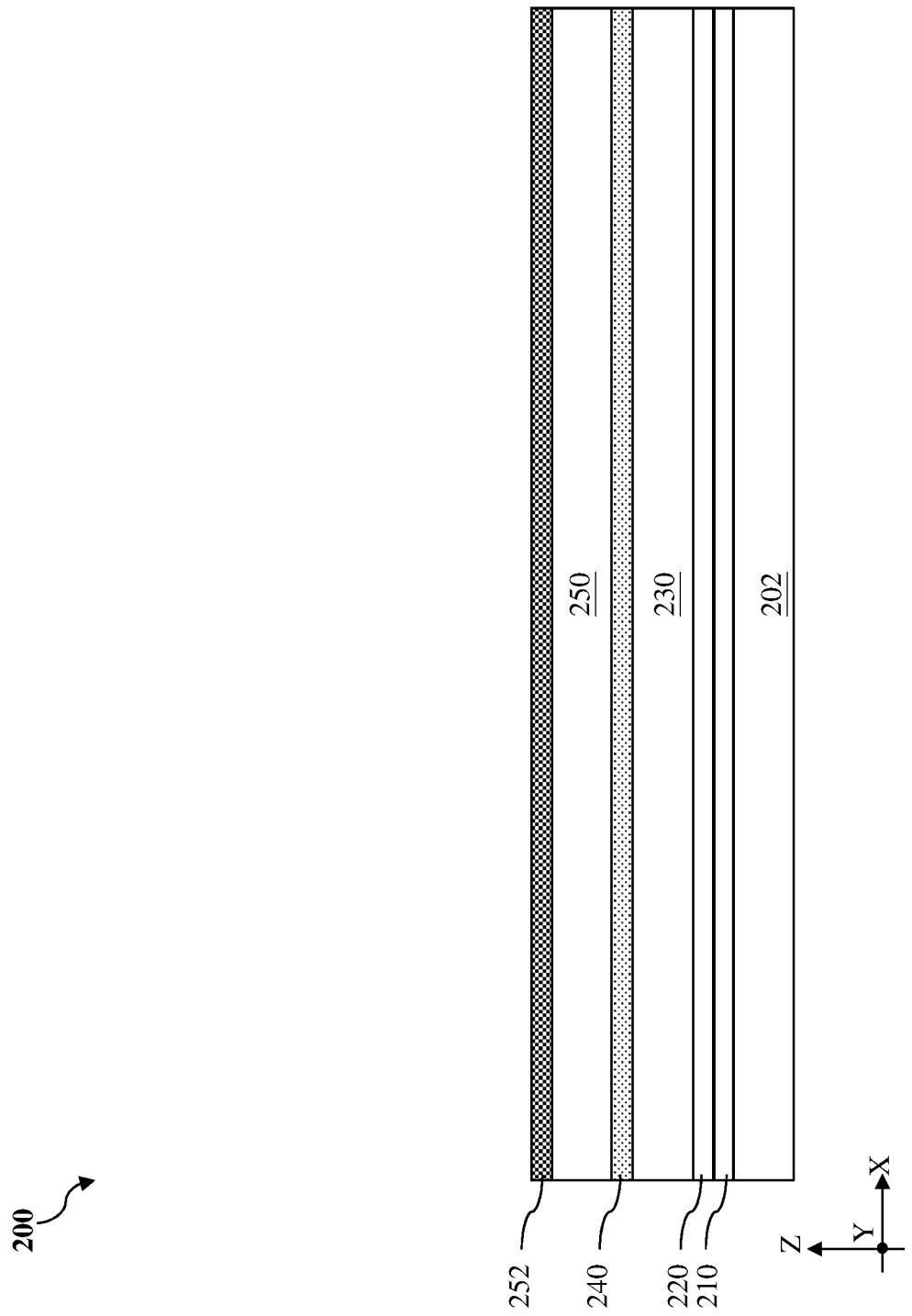
Figure 4:
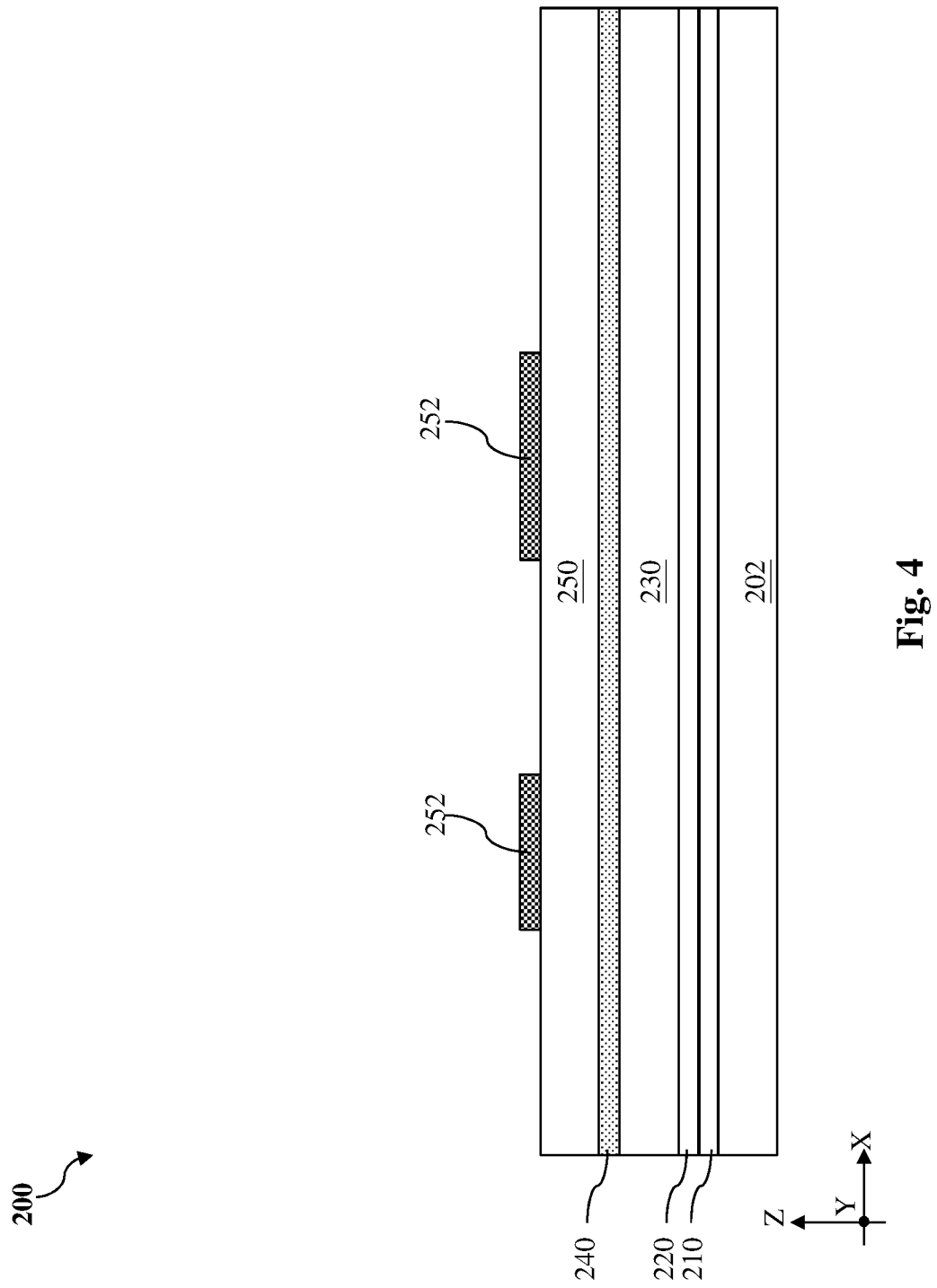
Figure 5:
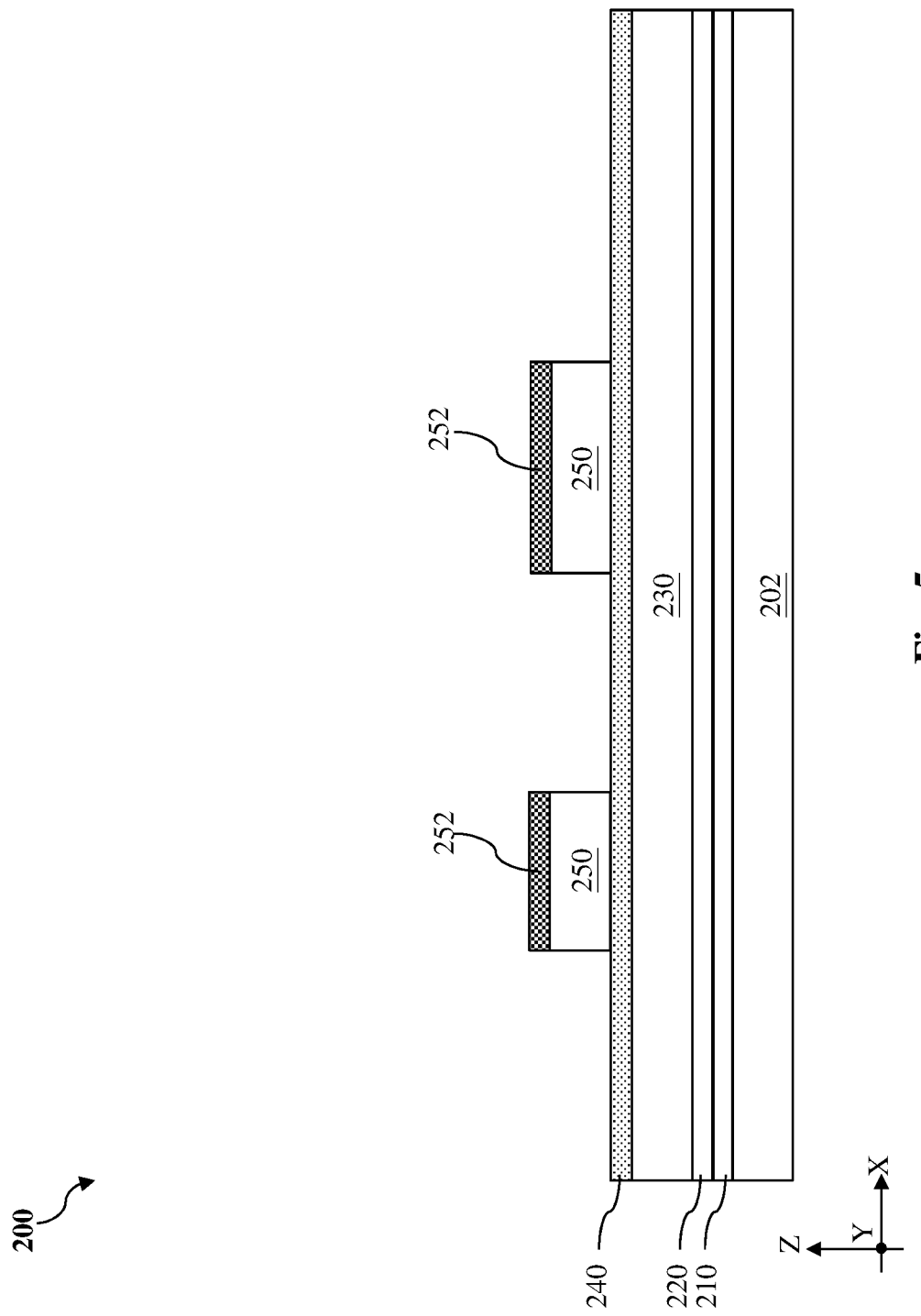
Figure 6:
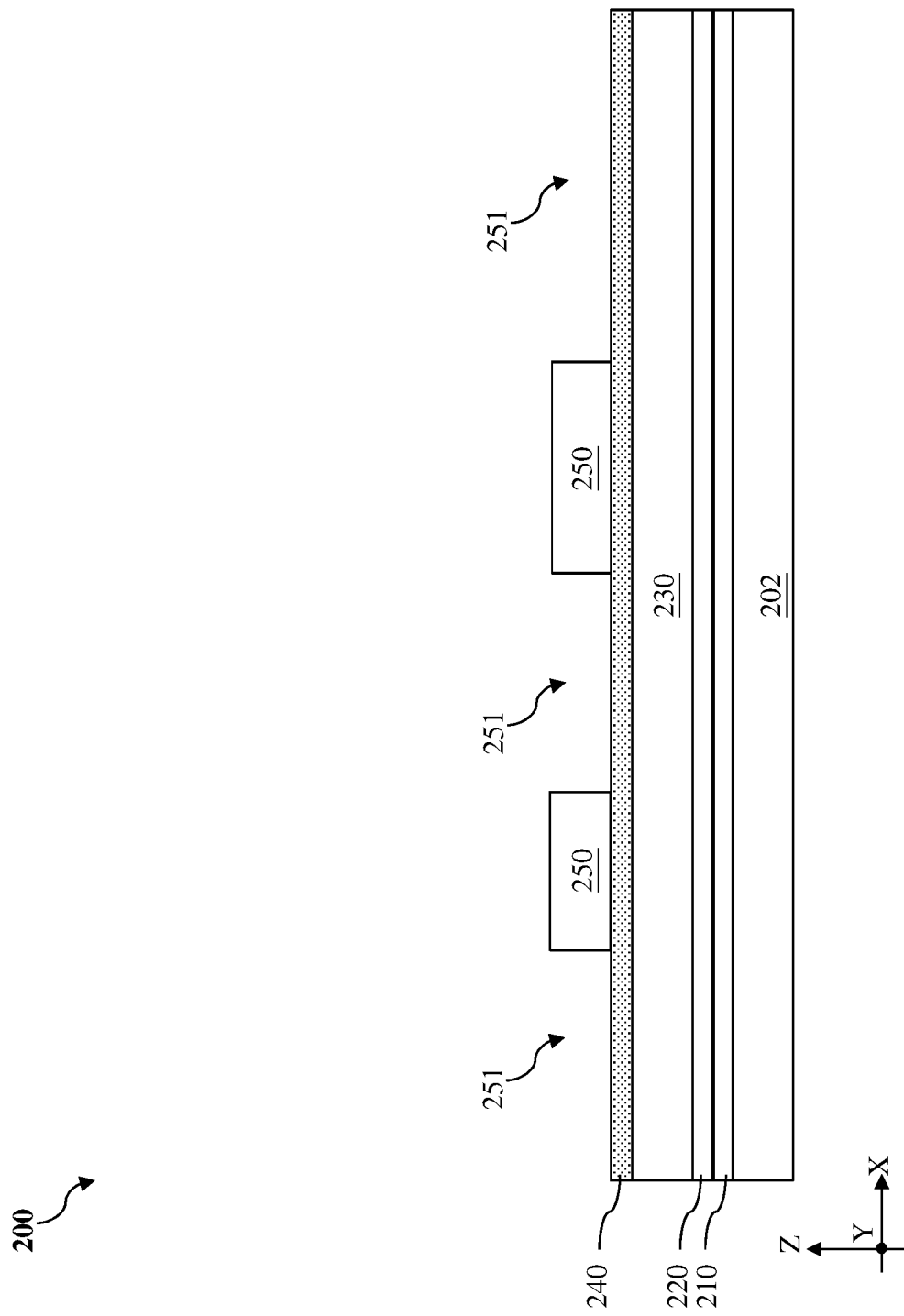

Referring to FIGS. 1 and 3-6, method 10 includes a block 14 where the first dielectric layer 250 is patterned to form trenches 251. In some implementations, patterning the first dielectric layer 250 involves multiple processes. As shown in FIG. 3, a silicon oxynitride (SiON) layer 252 is deposited on the first dielectric layer 250. In some embodiments, the SiON layer 252 is about 54 to about 66 nm thick. As shown in FIG. 4, the SiON layer 252 is patterned, for example, using a photolithography process. As shown in FIG. 5, the first dielectric layer 250 is etched to form trenches 251 therein using the SiON layer 252 as an etch mask. As shown in FIG. 6, the SiON layer 252 is removed after being used as an etch mask, leaving behind a patterned first dielectric layer 250.

Figure 7:
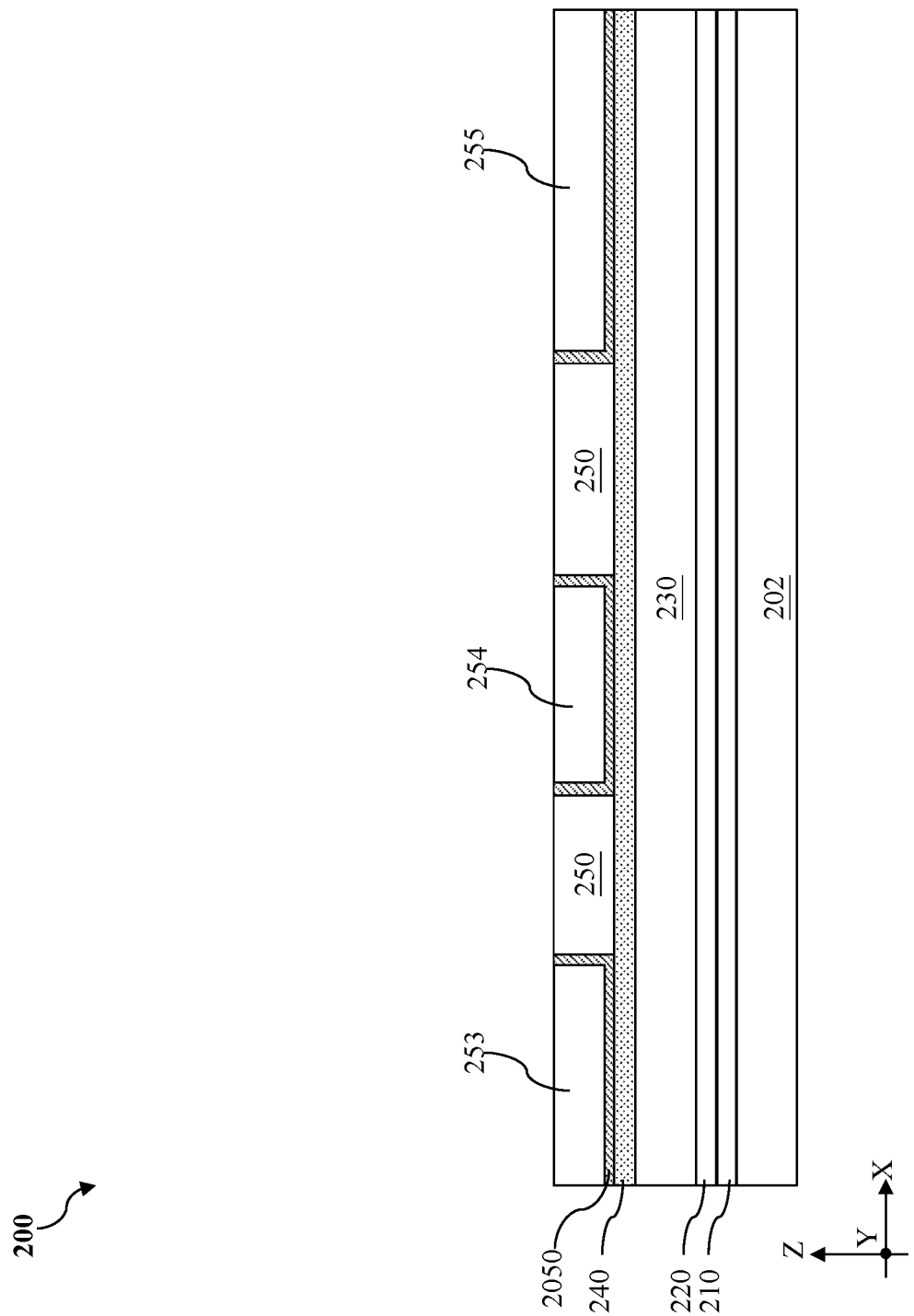

Referring to FIGS. 1 and 7, method 10 includes a block 16 where one or more lower contact features (such as 253, 254, and 255) are formed in the trenches 251 of the first dielectric layer 250. Although the lower contact features 253, 254, and 255 are disposed below upper contact features (to be discussed below), the lower contact features 253, 254, and 255 are sometimes referred to as top metal (TM) contacts because they may reside above transistor features (not shown in figures herein). Each of the lower contact features 253, 254, and 255 may include a barrier layer and a metal fill layer. Forming the lower contact features 253, 254, and 255 involves multiple processes. In some embodiments, a barrier layer 2050 is formed in each of the trenches 251, followed by the deposition of a metal fill layer over the barrier layer in the trenches. In some embodiments, the barrier layer 2050 includes titanium nitride, tantalum, tantalum nitride, or combinations thereof. In some embodiments, the metal fill layer includes a metal or metal alloy such as copper, cobalt, nickel, aluminum, tungsten, titanium, or combinations thereof. In some embodiments, the metal fill layer is formed by deposition or plating, followed by a chemical mechanical planarization (CMP) process. In an embodiment, about 5% to about 10% of the thickness of the first dielectric layer 250 is also removed by the CMP process. In an embodiment, the metal fill layer is formed of copper.

Figure 8:
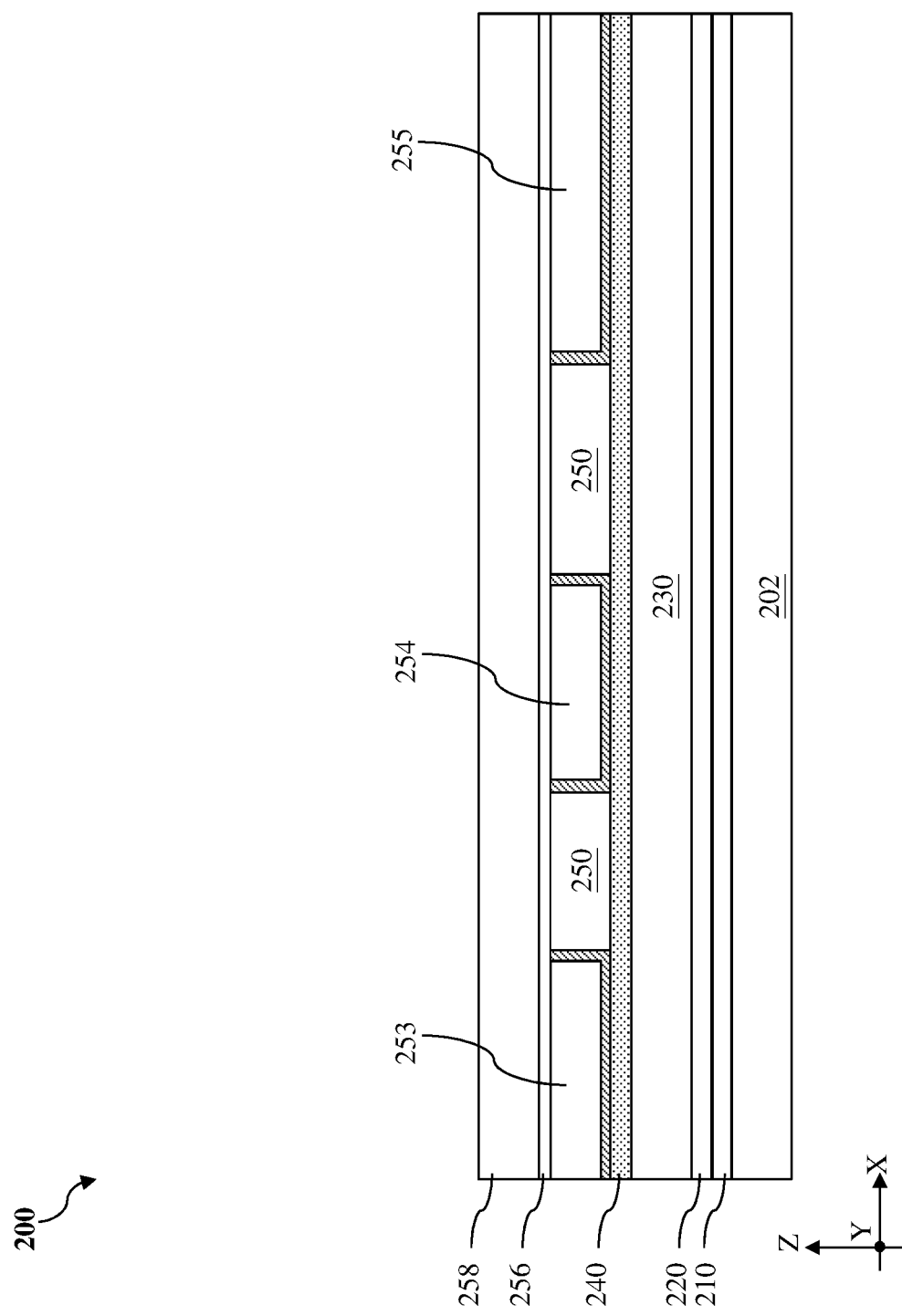

Referring to FIGS. 1 and 8, method 10 includes a block 18 where a second dielectric layer 256 is deposited over the lower contact features 253, 254, and 255. In some embodiments, the second dielectric layer 256 is about 65 to about 85 nm thick. The second dielectric layer 256 may include silicon carbonitride (SiCN), silicon nitride (SiN), and/or or other suitable materials that may protect the lower contact features 253, 254, and 255 from being oxidized. Also, at block 18, a third dielectric layer 258 is deposited over the second dielectric layer 256. In some embodiments, the third dielectric layer 258 is about 300 to about 500 nm thick. The third dielectric layer 258 may include an oxide material, such as undoped silica glass (USG), or other suitable material(s).

Referring to FIGS. 1 and 9-13, method 10 includes a block 20 where a metal-insulator-metal (MIM) structure 260 (shown in FIG. 13) is formed over the third dielectric layer 258. As shown in FIGS. 9-13, forming the MIM structure 260 involves multiple processes, including those for formation and patterning of a bottom conductor plate layer 262, a middle conductor plate layer 266, and a top conductor plate layer 269.

Figure 9:
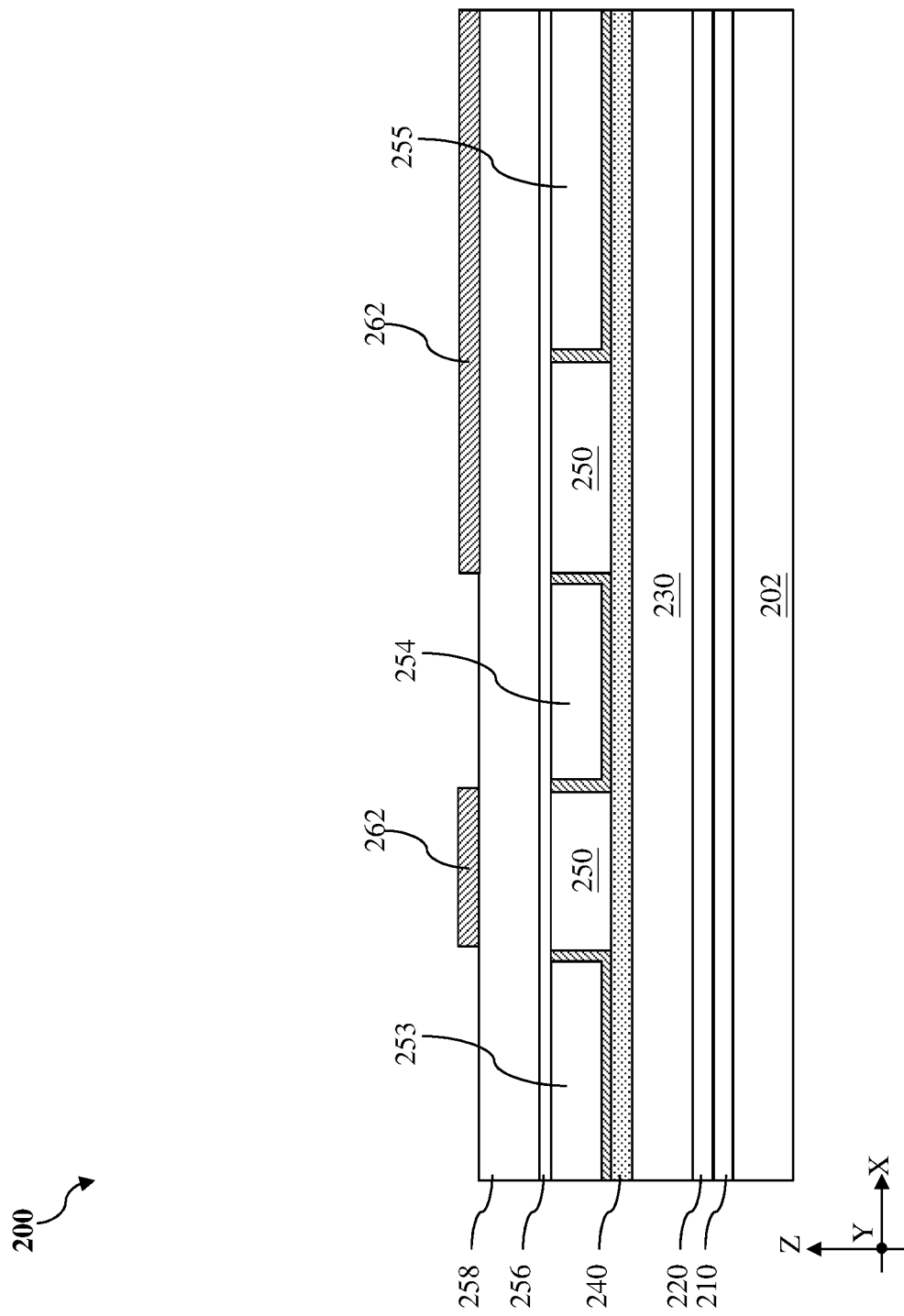
Figure 10:
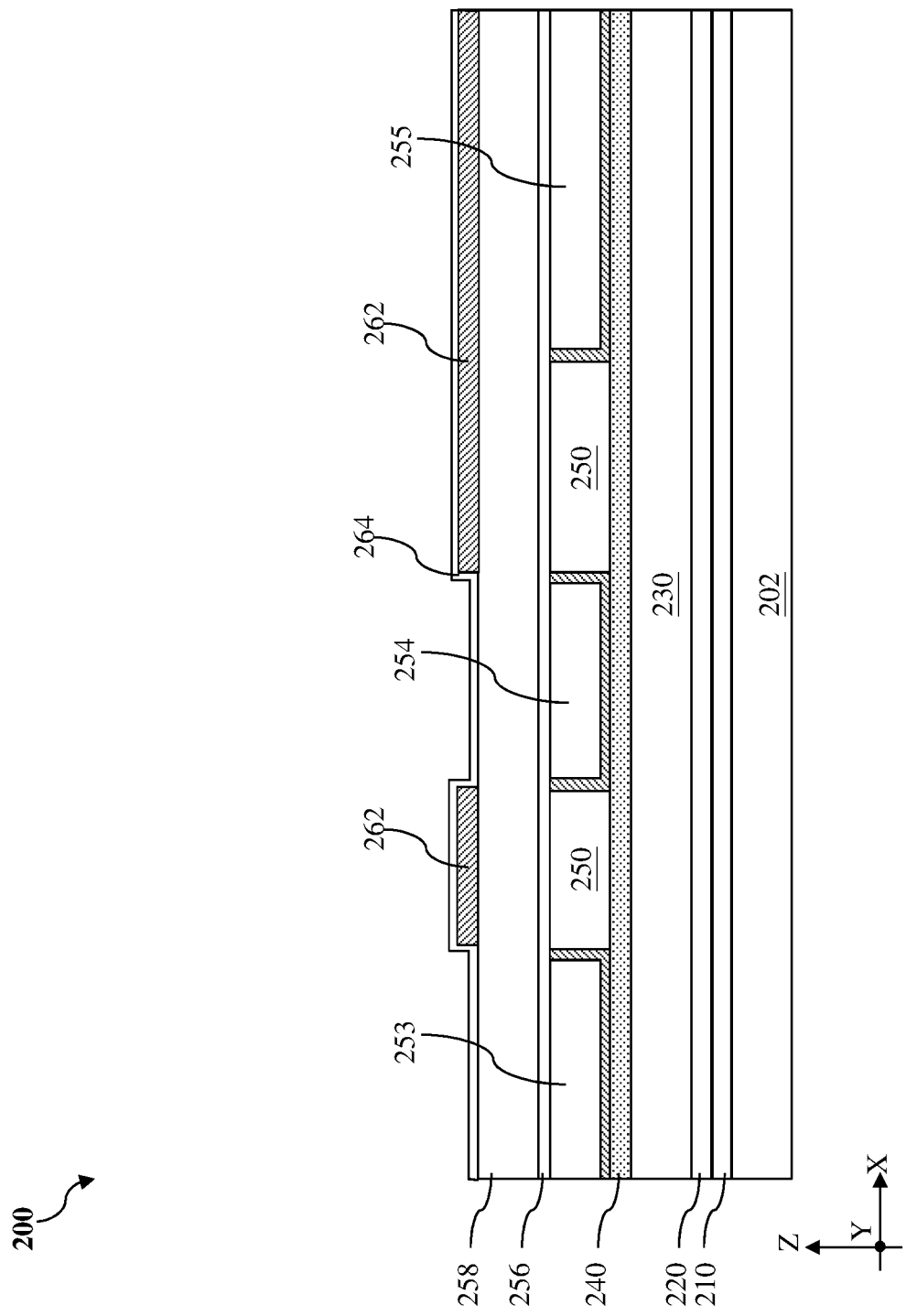
Figure 11:
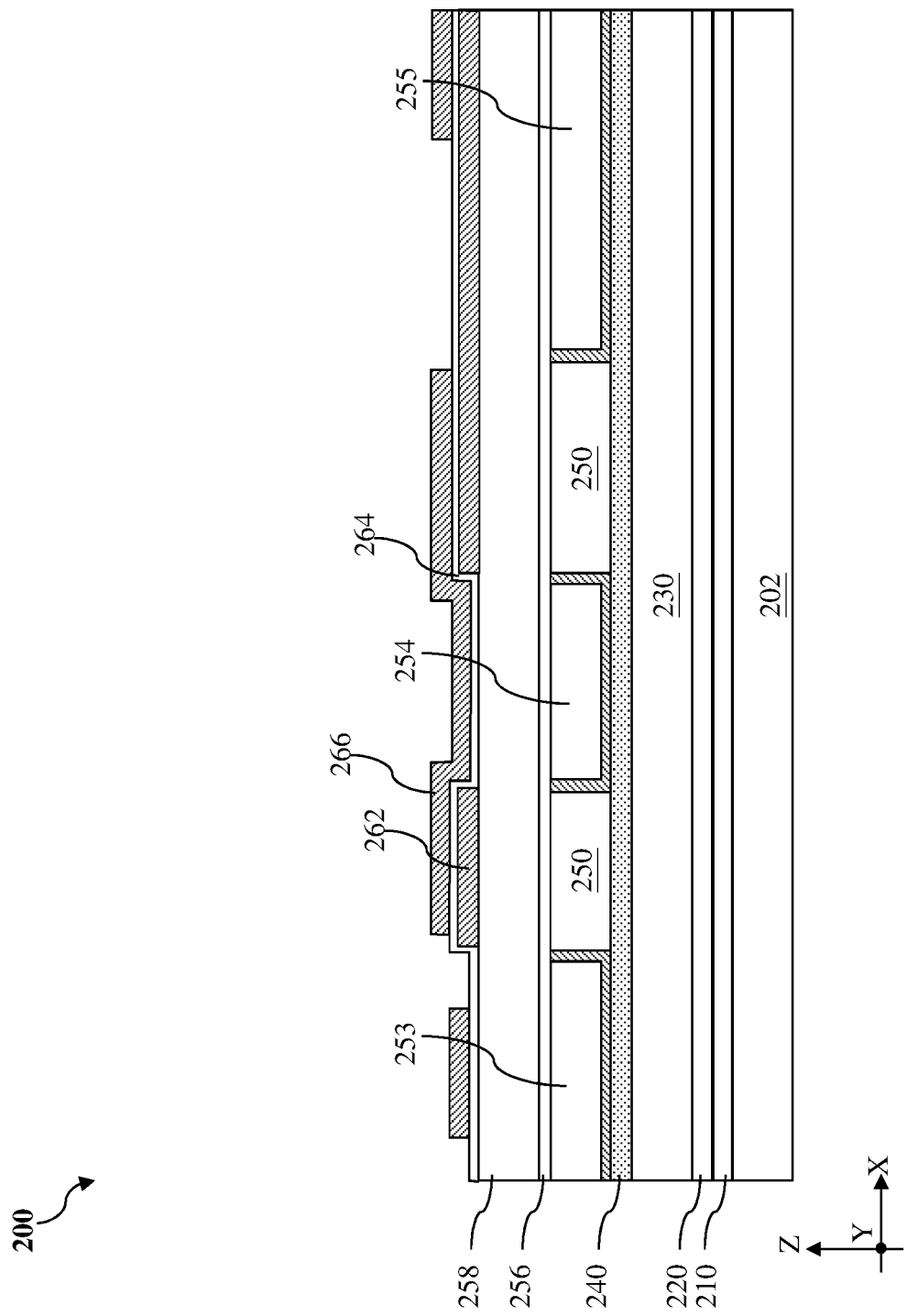
Figure 12:
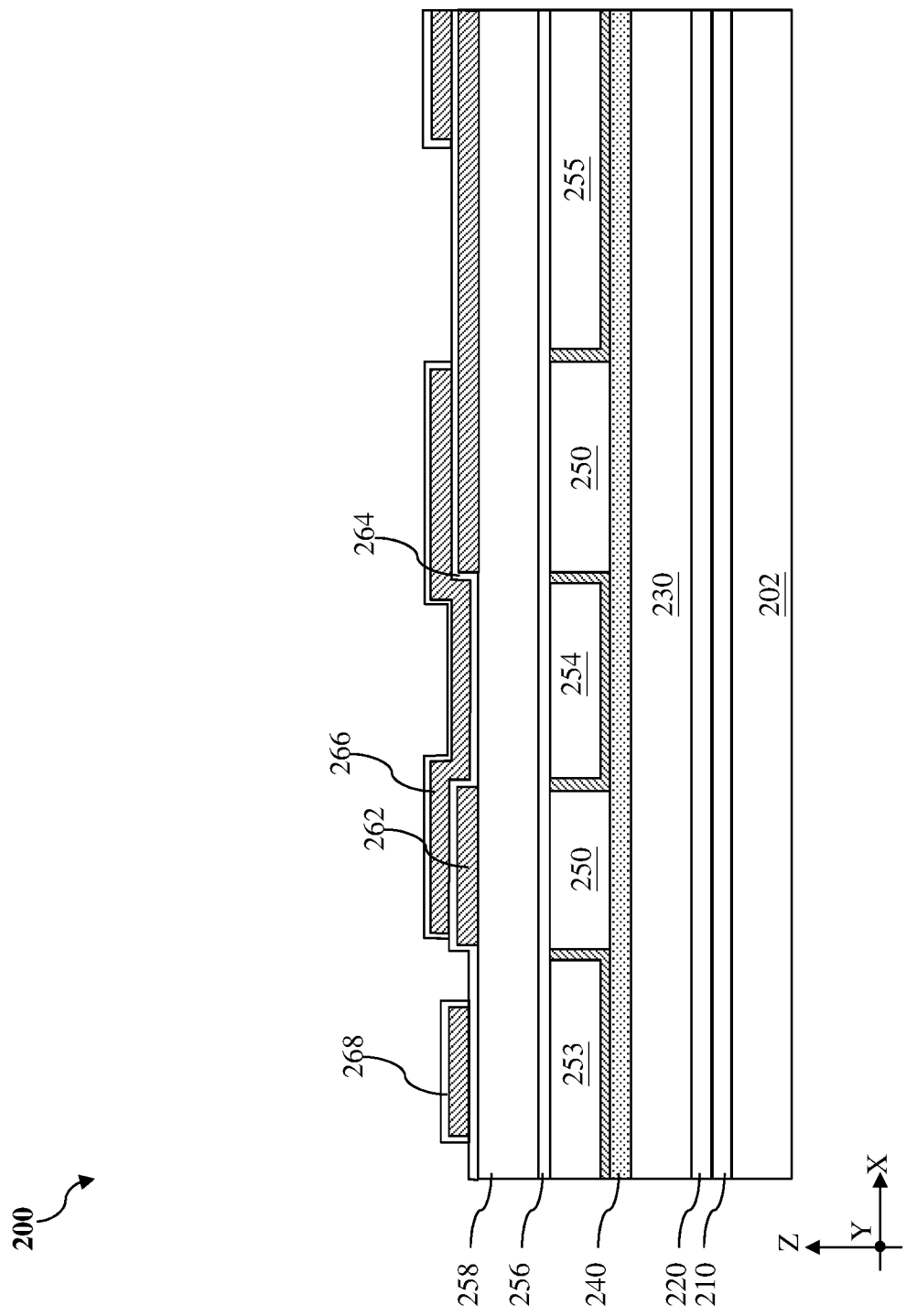
Figure 13:
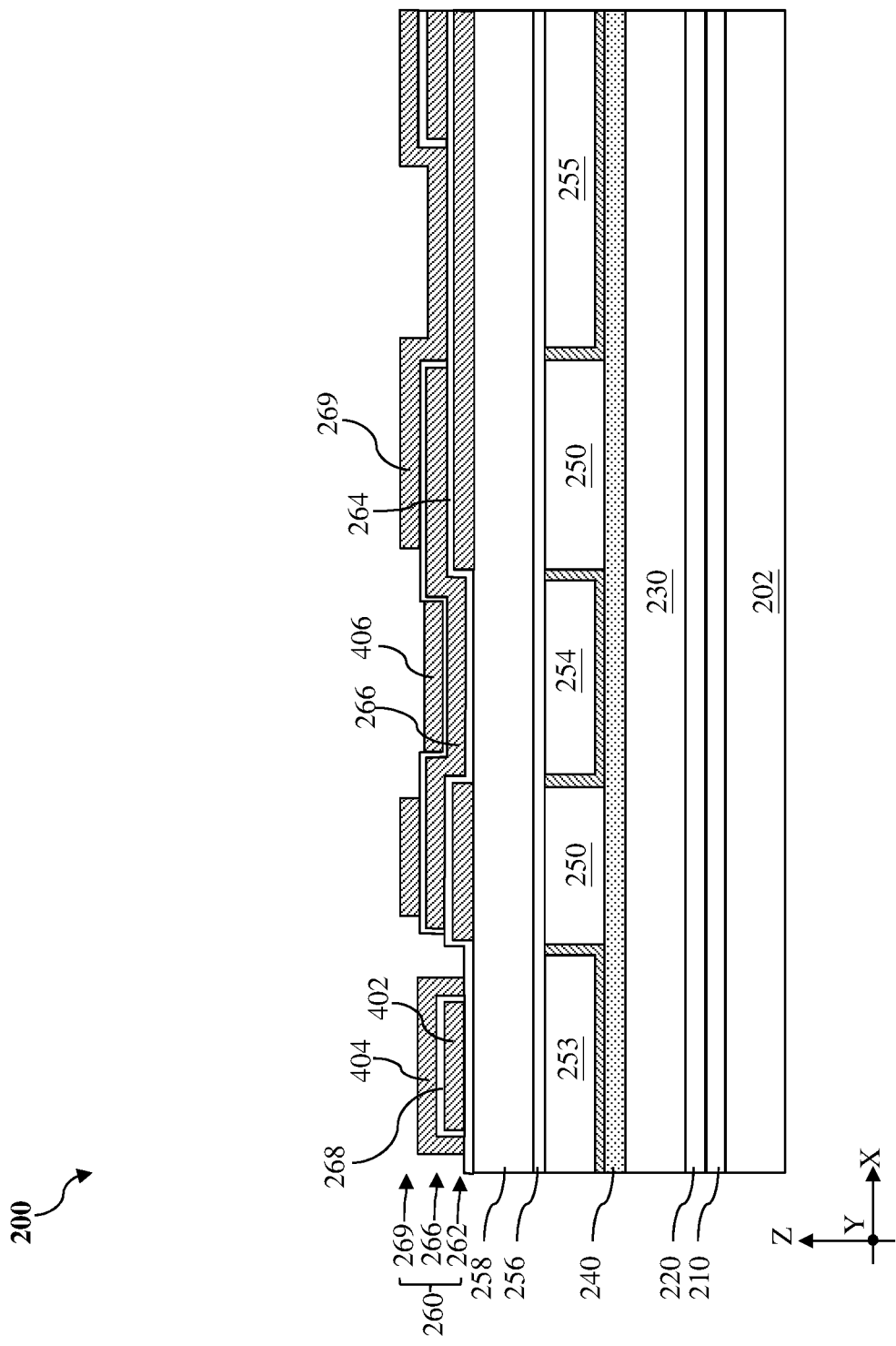

As shown in FIG. 9, a patterned bottom conductor plate layer 262 is formed on the third dielectric layer 258. Forming the bottom conductor plate layer 262 itself may involve multiple processes such as deposition, photolithography, development, and/or etching, etc. The bottom conductor plate layer 262 may go through surface treatment such as sidewall passivation using a nitrous oxide ($N_2O$) gas. In some embodiments, the bottom conductor plate layer 262 is about 40 nm to about 80 nm thick. As shown in FIG. 10, a first insulator layer 264 is formed on the bottom conductor plate layer 262. In an embodiment, the first insulator layer 264 is deposited to have a generally uniform thickness over the top surface of the workpiece 200 (e.g., having about the same thickness on top and sidewall surfaces of the bottom conductor plate layer 262). As shown in FIG. 11, a patterned middle conductor plate layer 266 is formed on the first insulator layer 264. The middle conductor plate layer 266 may be formed in a way similar to that used to form the bottom conductor plate layer 262, but the pattern of the middle conductor plate layer 266 may be different from that of the bottom conductor plate layer 262. As shown in FIG. 12, a second insulator layer 268 is formed on the middle conductor plate layer 266. In an embodiment, the second insulator layer 268 is deposited to have a generally uniform thickness over the top surface of the workpiece 200 (e.g., having about the same thickness on top and sidewall surfaces of the middle conductor plate layer 266). As shown in FIG. 13, a patterned top conductor plate layer 269 is formed on the second insulator layer 268. The top conductor plate layer 269 may be formed in a way similar to that used to form the middle conductor plate layer 266 or the bottom conductor plate layer 262, but the pattern of the top conductor plate layer 269 may be different from that of the middle conductor plate layer 266 or the bottom conductor plate layer 262. In some embodiments, to prevent electromigration and oxygen diffusion, the conductor plate layers in the MIM structure 260 may be formed of a transition metal or a transition metal nitride. For example, the conductor plate layers in the MIM structure 260 may be formed of titanium, tantalum, titanium nitride, or tantalum nitride.

As illustrated in FIG. 13, the MIM structure 260 includes multiple metal layers including the bottom conductor plate layer 262, the middle conductor plate layer 266, and the top conductor plate layer 269, which function as metal plates of capacitors. The MIM structure 260 also includes multiple insulator layers including the first insulator layer 264 disposed between the bottom conductor plate layer 262 and the middle conductor plate layer 266, as well as the second insulator layer 268 disposed between the middle conductor plate layer 266 and the top conductor plate layer 269. The MIM structure 260 is used to implement one or more capacitors, which may be connected to other electric components such as transistors. The multi-layer MIM structure 260 allows capacitors to be closely packed together in both vertical and lateral directions, thereby reducing the amount of lateral space needed for implementing capacitors. As a result, the MIM structure 260 may accommodate super high density capacitors.

In some embodiments, to increase capacitance values, the first insulator layer 264 and/or the second insulator layer 268 use high-k dielectric material(s) whose k-value is bigger than that of silicon oxide. The first and second insulator layers 264 and 268 may be relatively thin to increase capacitance values. However, minimal thicknesses for the first and second insulator layers 264 and 268 are maintained to avoid potential breakdown of the capacitors in the MIM structure 260 (e.g., when two capacitor plates have high potential difference, current may leak between the plates, causing breakdown). In some embodiments, each of the first and second insulator layers 264 and 268 is about 6 nm to about 20 nm thick. In some implementations, each of the first insulator layer 264 and the second insulator layer 268 may be formed of zirconium oxide ($ZrO_2$), hafnium oxide ($HfO_2$), aluminum oxide ($Al_2O_3$), tantalum oxide ($TaO_5$), silicon oxide ($SiO_2$), or titanium oxide ($TiO_2$). Further, to optimize the capacitor performance, in some embodiments, the first insulator layer 164 (or the second insulator layer 168) is a tri-layer structure including, from bottom to top, a first zirconium oxide ($ZrO_2$) layer, an aluminum oxide ($Al_2O_3$) layer, and a second zirconium oxide ($ZrO_2$) layer, where each of the layers is about 15 to about 25 nm thick.

Figure 14:
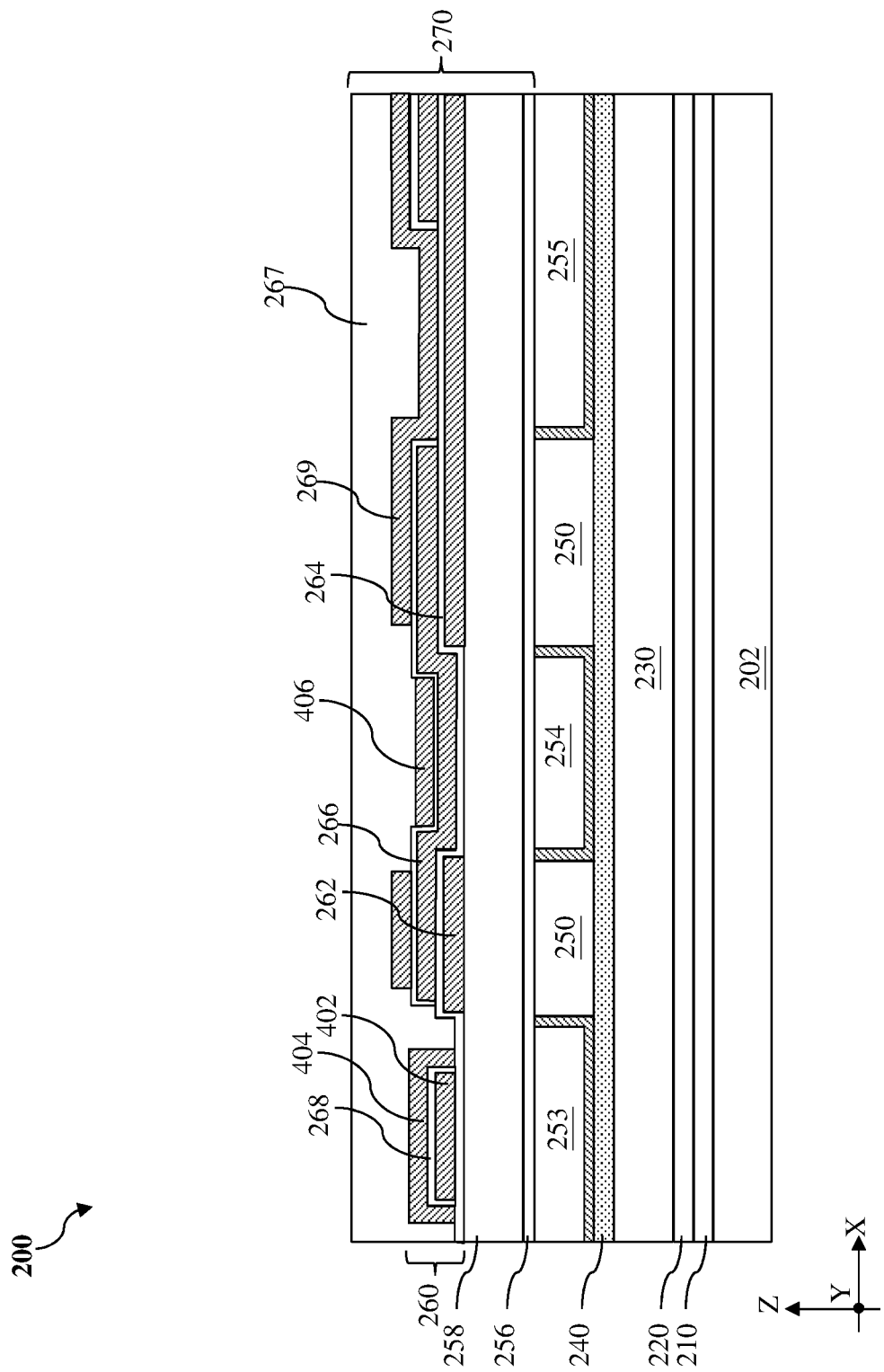
Figure 15:
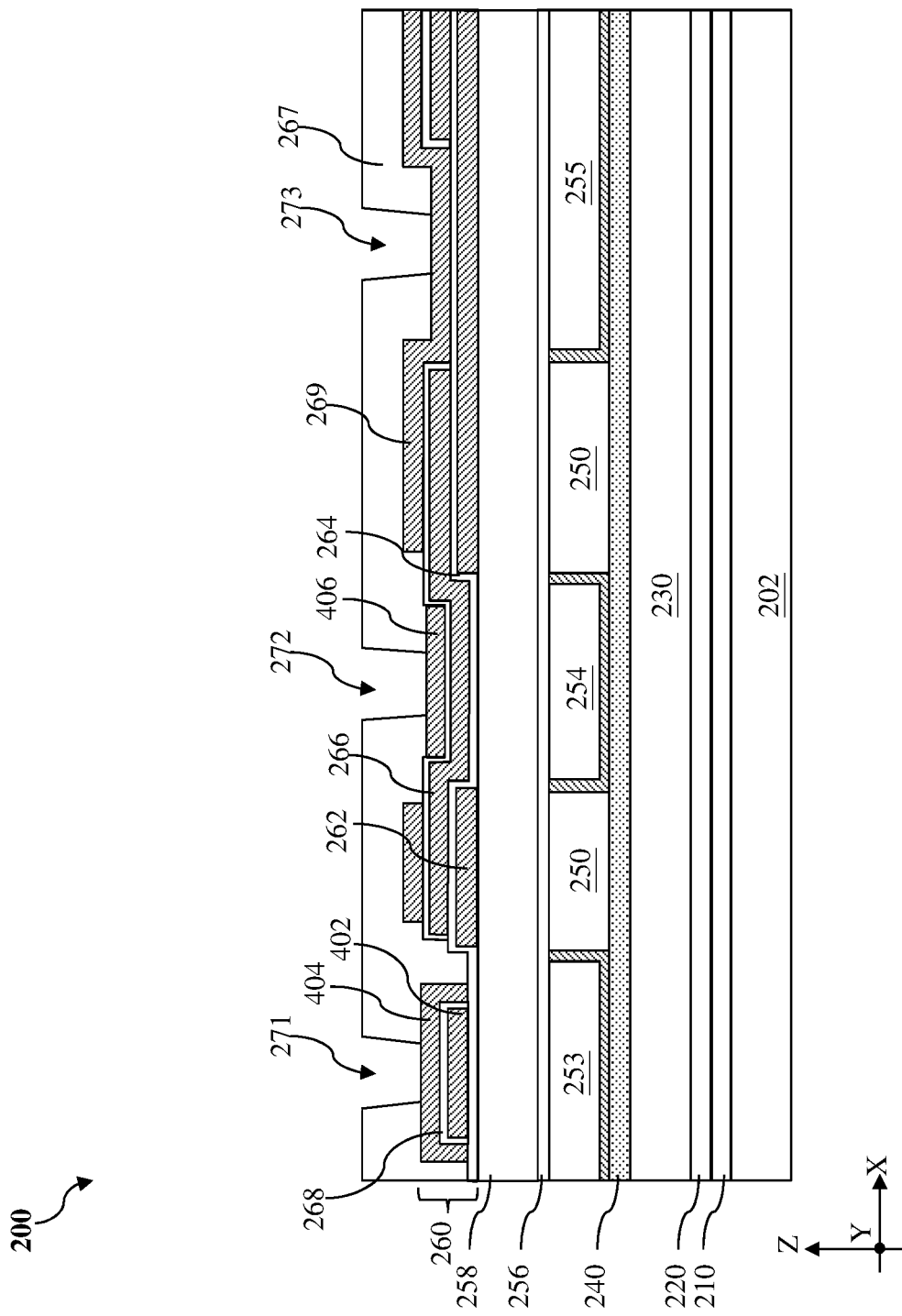

Referring to FIGS. 1 and 14, method 10 includes a block 22 where a fourth dielectric layer 267 is deposited over the MIM structure 260. In some embodiments, the fourth dielectric layer 267 is about 400 to about 500 nm thick. In some embodiments, the third dielectric layer 258 may include an oxide material, such as undoped silica glass, or other suitable material(s). In some embodiments, the fourth dielectric layer 267 is formed by depositing about 900 to about 1000 nm of the oxide material, followed by a CMP process to reach the final thickness. As shown in FIG. 15, the MIM structure 260 is sandwiched between the third dielectric layer 258 and the fourth dielectric layer 267, which may have the same material and/or the same thickness. In some embodiments, the second dielectric layer 256, the third dielectric layer 258, the MIM structure 260, and the fourth dielectric layer 267 are regarded as parts of a first multi-layer passivation structure 270. Alternatively, if the MIM structure 260 is not present in the passivation structure 270, the third dielectric layer 258 and the fourth dielectric layer 267 may be combined as a single dielectric layer (e.g., about 900 to about 1100 nm thick) over the second dielectric layer 256.

Referring to FIGS. 1 and 15-17, method 10 includes a block 24 where one or more openings (such as openings 271, 272, and 273) are formed to penetrate through, from top to bottom, the fourth dielectric layer 267, the MIM structure 260, the third dielectric layer 258, and the second dielectric layer 256, using a plurality of etch processes. In some embodiments, operations at block 24 include a first etch process to etch through the fourth dielectric layer 267, a second etch process to etch through the MIM structure 260, and a third etch process to etch through the third dielectric layer 258. An implementation of the first etch process is illustrated in FIG. 15. The first etch process may be a dry etch process using sulfur hexafluoride (SF$_6$) as an etchant. The first etch process is time-controlled such that it terminates at the top conductor plate layer 269. In FIG. 15, the top conductor plate layer 269 includes dummy plates 404 and 406 that are insulated from the rest of the top conductor plate layer 269 even though they are deposited along with the rest of the top conductor plate layer 269. As described above, the dummy plates are inserted to prevent uneven etch loading.

Figure 16:
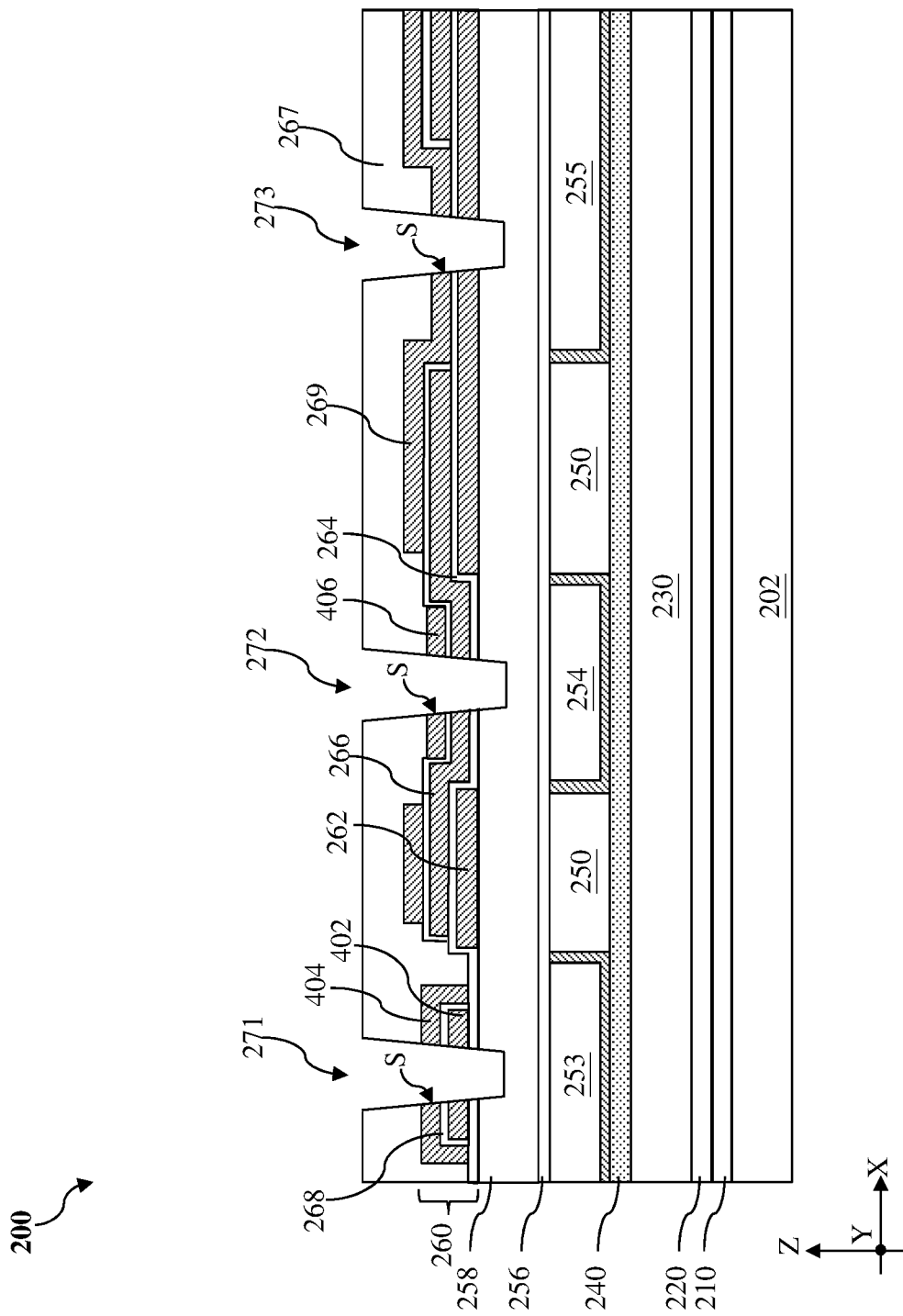

An implementation of the second etch process is illustrated in FIG. 16. The second etch process may be a dry etch process. An etchant for the second etch process is selected such that a reaction of the etchant and the conductor plate layers does not produce any non-volatile byproducts that are not readily removable during the second etch process. In some embodiments, the etchant for the second etch process is chlorine-based, such as chlorine (Cl$_2$). In other words, the etchant for the second etch process is fluorine-free or fluorine-atom free. It has been observed when the conductor plate layers are formed of transition metals or transition metal nitrides, the second etch process produces transition metal chloride, such as titanium chloride or tantalum chloride, which are volatile and readily removable. In addition, because the second etch process does not produce any byproducts that may be redeposited along sidewalls (S), the etch rate at which the second etch process etches through the MIM structure 260 is substantially homogeneous. As a result, sidewalls (S) of the opening along the MIM structure 260 are characterized by a linear taper. In some implementations, the second etch process is time-controlled such that it terminates after it etches completely through all of the conductor plate layers in the MIM structure 260. In some instances, the second etch process may extend the openings (including openings 271, 272, and 273) downward to a level below the MIM structure 260. The second etch process does not cause dishing on the top surface of the third dielectric layer 258 because no non-volatile byproducts are redeposited on the third dielectric layer 258 near the sidewalls of the openings (including openings 271, 272, and 273). That is, upon conclusion of the second etch process, the bottom surfaces of the openings (including openings 271, 272, and 273) are substantially planar. The planar bottom surface of the openings prevent dishing during the third etch process.

Figure 17:
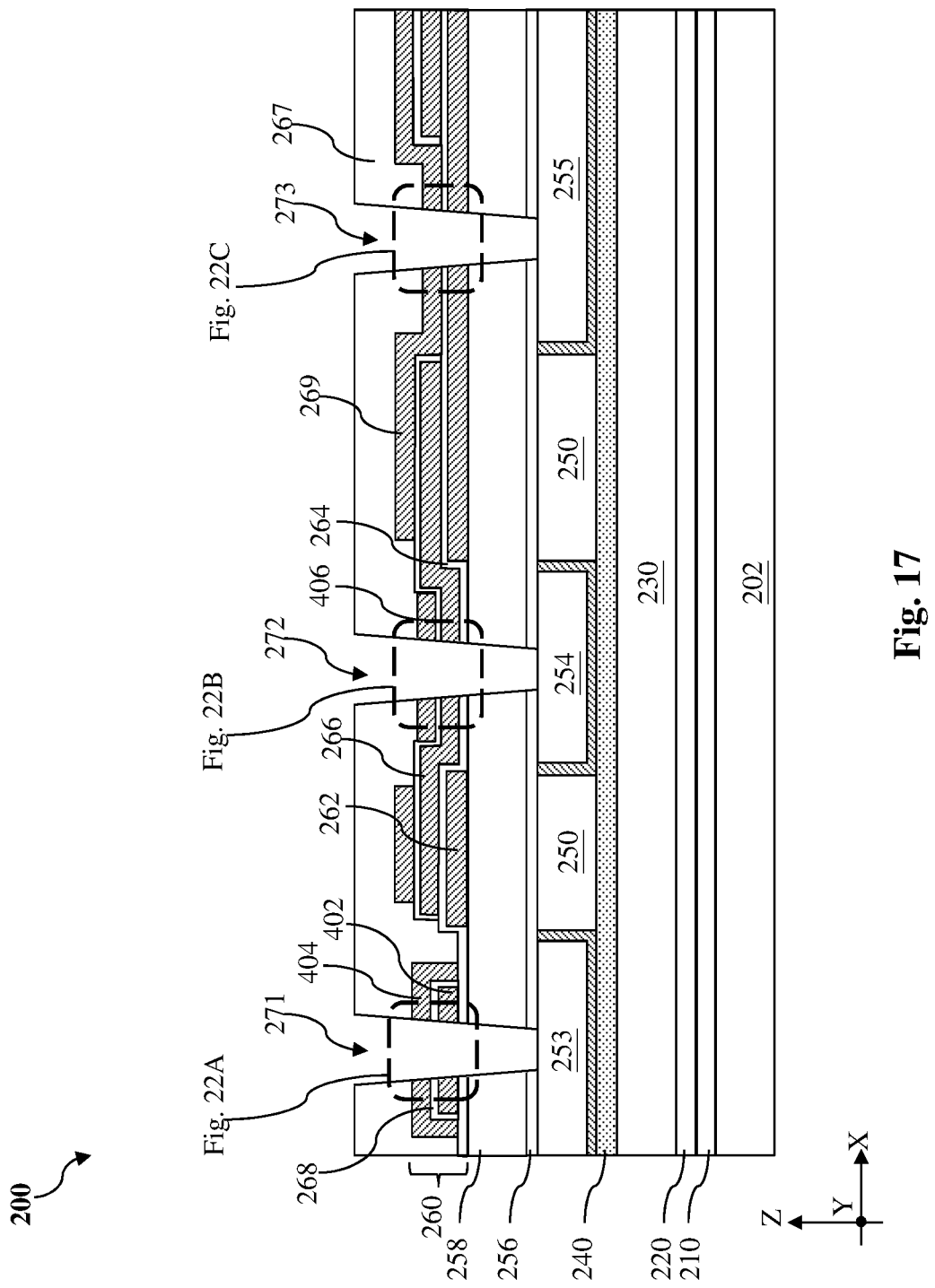

An implementation of the third etch process is illustrated in FIG. 17. The third etch process may be a dry etch process using an etchant that etches the third dielectric layer 258 and the second dielectric layer 256 faster than the second etch process. Further, the etchant for the third etch process is selected such that it does not damage the lower contact features 253, 254, and 255. For example, chlorine in an example second etch process etches oxide and nitride at a rate slower than that of carbon tetrafluoride (CF$_4$). Chlorine is also known to cause damages to copper, which may be the material of the lower contact features 253, 254, and 255. In some embodiments, the third etch process uses carbon tetrafluoride as an etchant. As illustrated in FIG. 17, the third etch process further extends the openings (including openings 271, 272, and 273) downwards until the lower contact features (including 253, 254 and 255) are exposed. At this point, the openings 271, 272 and 273 are substantially formed. In some implementations, one or more rinse or cleaning processes may be performed to clean the exposed conductive surfaces, such as the sidewalls (S) through the MIM structure 260 and the exposed portions of the lower contact features 253, 254 and 255.

Figures 21A, 21B, 21C:
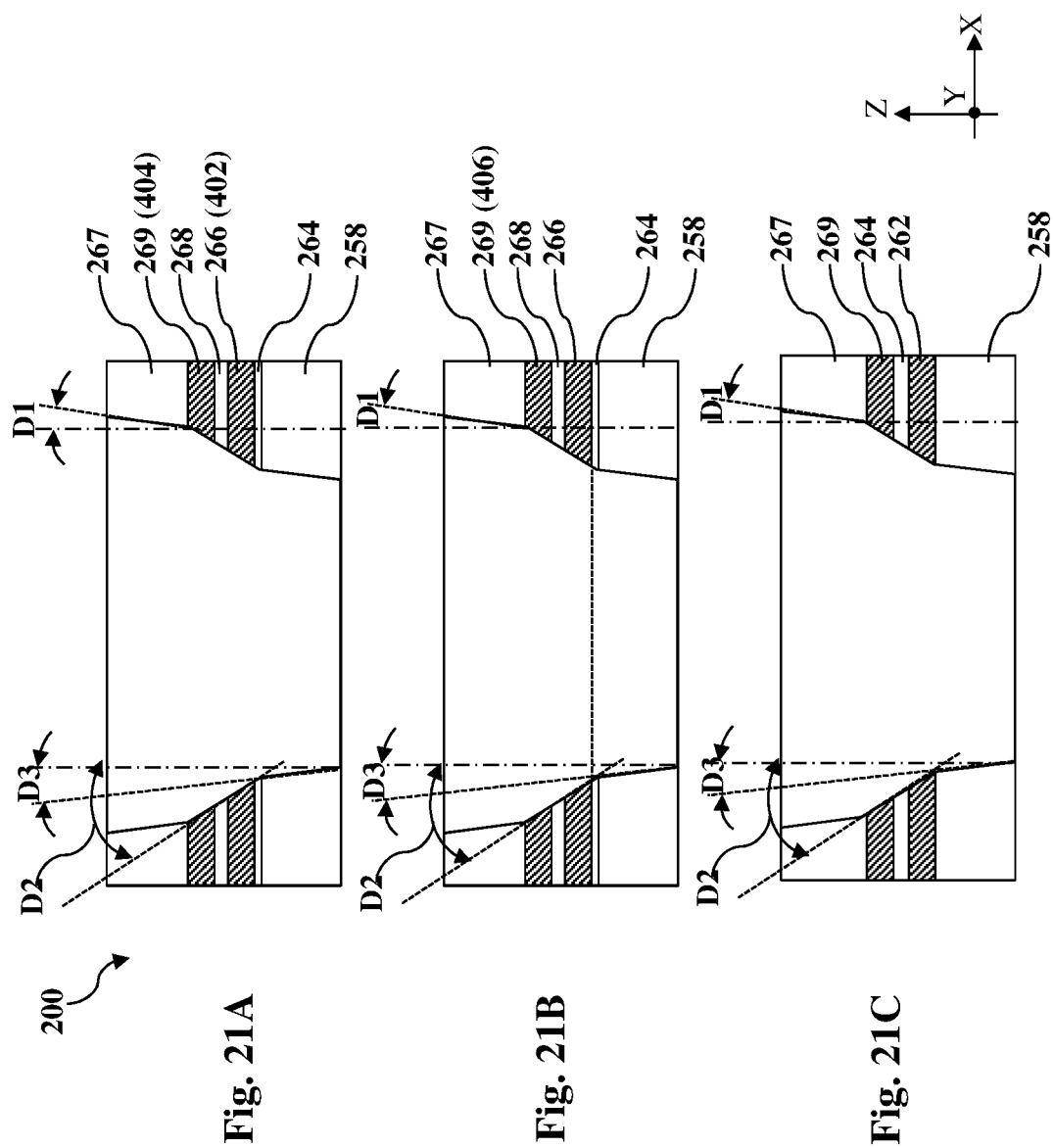
FIGS. 21A, 21B and 21C are fragmentary cross-sectional views of openings through conductor plate layers in an MIM structure in accordance with embodiments of the present disclosure.

The profiles of the openings 271, 272 and 273 shown in FIG. 17 are simplified for ease of illustration. In reality, different etch processes may etch different layers at different rates to form tapers of different tapering angles. Detailed sideview illustrations of the openings 271, 272 and 273 through the MIM structure 260 are respectively and representatively illustrated in FIGS. 21A, 21B and 21C. Reference is first made to FIG. 21A. The first etch process etches through the fourth dielectric layer 267 at a homogeneous rate, resulting in a linear taper profile that tapers at a first tapering angle D1 with respect to a direction normal (perpendicular) to the substrate 202. The second etch process etches through the MIM structure 260 at a substantially homogeneous rate, resulting in a linear taper profile that tapers at a second tapering angle D2 with respect to a direction normal (perpendicular) to the substrate 202. The third etch process etches through the third dielectric layer 258 at a substantially homogeneous rate, resulting in a linear taper profile that tapers at a third tapering angle D3 with respect to a direction normal (perpendicular) to the substrate 202. In some embodiments, D2 may be greater than D1 and D3 and D3 may be greater than D1. In some instances, D1 is between about 0° and about 10°, D2 is between about 35° and about 45°, and D3 is between about 15° and about 20°. It is noted that while the second etch process etches the first insulator layer 264 and the second insulator layer 268 at a rate different from the rate it etches the conductor plate layers. However, because the etch rate through the MIM structure 260 is controlled by the etch rate through the thicker conductor plate layers, the portion of the openings through the MIM structure 260 has a substantially linear tapering profile. Based on the etch processes used to form the openings and the different tapering profiles, each of the openings 271, 272 and 273 may be viewed as having three portions—a top portion with the first tapering angle D1, a middle portion with the second tapering angle D2, and a bottom portion with the third tapering angle D3.

FIGS. 21A, 21B and 21C also illustrate that each of the openings 271, 272 and 273 are formed through two conductor plate layers. The opening 271 penetrates a dummy plate 402 in the middle conductor plate layer 266 and a dummy plate 404 in the top conductor plate layer 269. The opening 272 penetrates a dummy plate 406 in the top conductor plate layer 269 and the middle conductor plate layer 266. The opening 273 penetrates the top conductor plate layer 269 and the bottom conductor plate layer 262. Each of the dummy plates is insulated from the rest of the conductor plate layer in which it resides and is thereby electrically floating.

Figure 18:
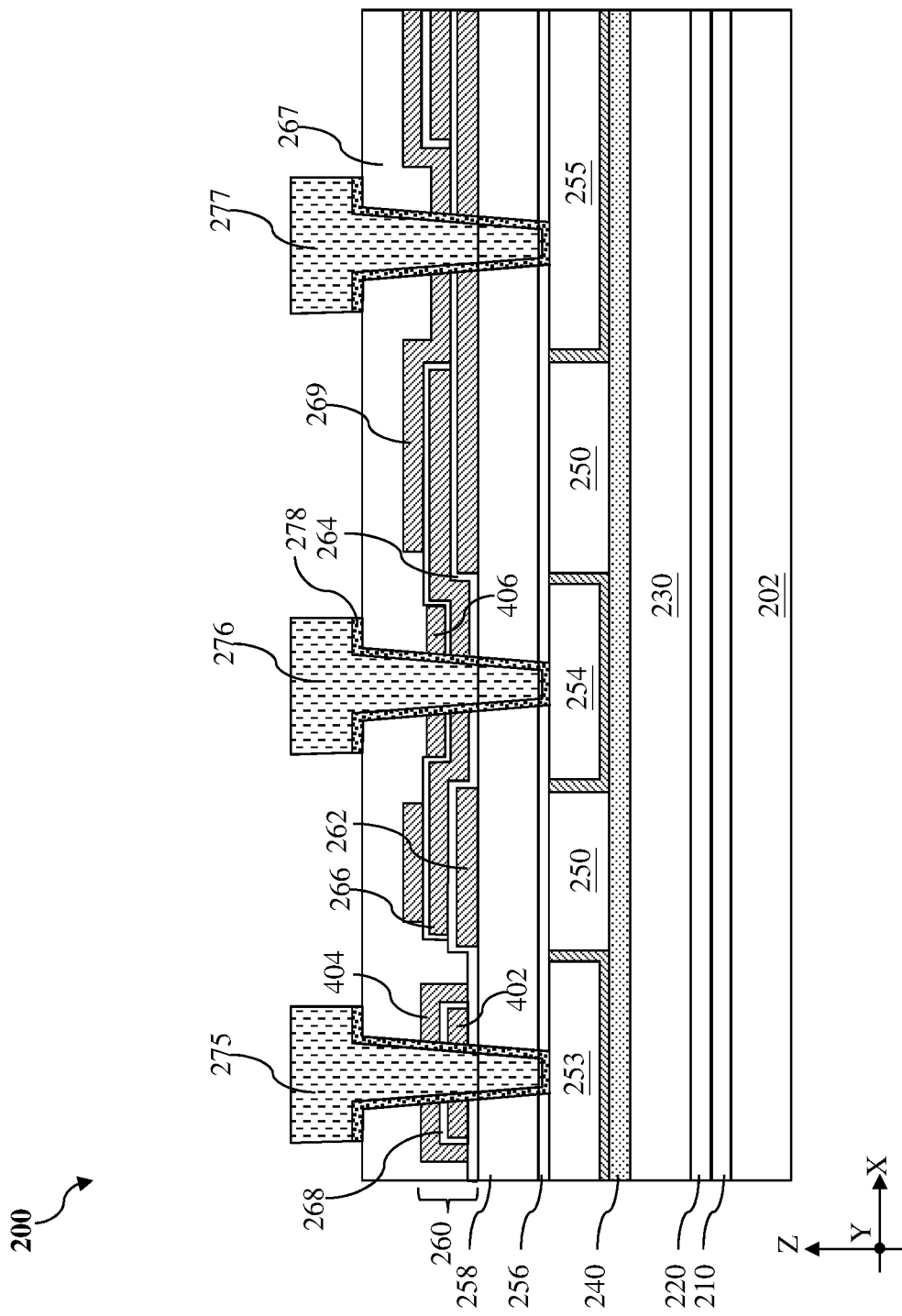

Referring to FIGS. 1 and 18, method 10 includes a block 26 where one or more upper contact features (such as 275, 276, and 277) are formed in and over the openings 271, 272, and 273, respectively. The upper contact features 275, 276, and 277 include contact vias that fill the openings 271, 272 and 273 and may be referred to as contact via, metal vias, or metal lines. In some embodiments, to form the one or more upper contact features (such as 275, 276 and 277), a barrier layer 278 is first conformally deposited over the fourth dielectric layer 267 and into the openings 271, 272 and 273 using a suitable deposition technique, such as atomic layer deposition (ALD), physical vapor deposition (PVD) or chemical vapor deposition (CVD) and then a metal fill layer is deposited over the barrier layer 278 using a suitable deposition technique, such as ALD, PVD or ALD. In some embodiments, the barrier layer 278 may be formed of the same material of the conductor plate layers. In those embodiments, the barrier layer 278 may be formed of titanium, tantalum, titanium nitride, or tantalum nitride. The metal fill layer may be formed of copper, aluminum, or an alloy thereof. In some instances, the metal fill layer for the upper contact features may include about 95% of aluminum and 5% of aluminum. The deposited barrier layer 278 and the metal fill layer are then patterned to form upper contact features 275, 276 and 277, as illustrated in the example in FIG. 18. In some embodiments, the barrier layer 278 and the metal fill layer are patterned in a two-stage or multiple-stage etch process. In embodiments represented in FIG. 18, portions of the upper contact features 275, 276 and 277 above the fourth dielectric layer 267 have substantially straight sidewalls. In other embodiments not explicitly shown in FIG. 18, portions of the upper contact features 275, 276 and 277 above the fourth dielectric layer 267 have tapered sidewalls. In some implementations, the anisotropic etch process step etches faster than the isotropic etch process step and requires more energy. While not shown in the figures, the upper contact features may have a square shape, a circular shape, an oval shape, a racetrack shape, a polygon shape, or a rectangular shape when viewed along the Z direction.

At least the upper portion of the upper contact features 275, 276, and 277 are part of a redistribution layer (RDL) to reroute bond connections between upper and lower layers. The upper contact features 275, 276, and 277 each penetrate through, from top to bottom, the fourth dielectric layer 267, the MIM structure 260, the third dielectric layer 258, and the second dielectric layer 256. The upper contact features 275, 276, and 277 make electrical contact with the lower contact features 253, 254, and 255, respectively. The upper contact feature 275 is a logic contact via that is electrically coupled to the lower contact feature 253 but electrically insulated from the functional portion of the MIM structure 260. While the upper contact feature 275 is electrically coupled to the dummy plate 402 and the dummy plate 404, the dummy plate 402 and the dummy plate 404 are electrically floating. As such the upper contact feature 275 is electrically insulated from any of the bottom conductor plate layer 262, the middle conductor plate layer 266, and the top conductor plate layer 269. The upper contact feature 277 is an MP contact via that is electrically coupled to the middle conductor plate layer 266 but is electrically insulated from the bottom conductor plate layer 262 and the top conductor plate layer 269. While the upper contact feature 277 is electrically coupled to the dummy plate 406, the dummy plate 406 is electrically floating and is electrically insulated from the rest of the top conductor plate layer 269. The upper contact feature 279 is a TPBP contact via that is electrically coupled to the bottom conductor plate layer 262 and the top conductor plate layer 269 but is electrically insulated from the middle conductor plate layer 266.

While not explicitly shown in FIG. 18, the shapes and profiles of the upper contact features 275, 276 and 277 generally track those of the openings 271, 272 and 273. That is, the upper contact features 275, 276 and 277 will track the taper profiles illustrated in FIGS. 21A, 21B and 21C. Detailed descriptions in this regard are omitted for brevity.

Figure 19:
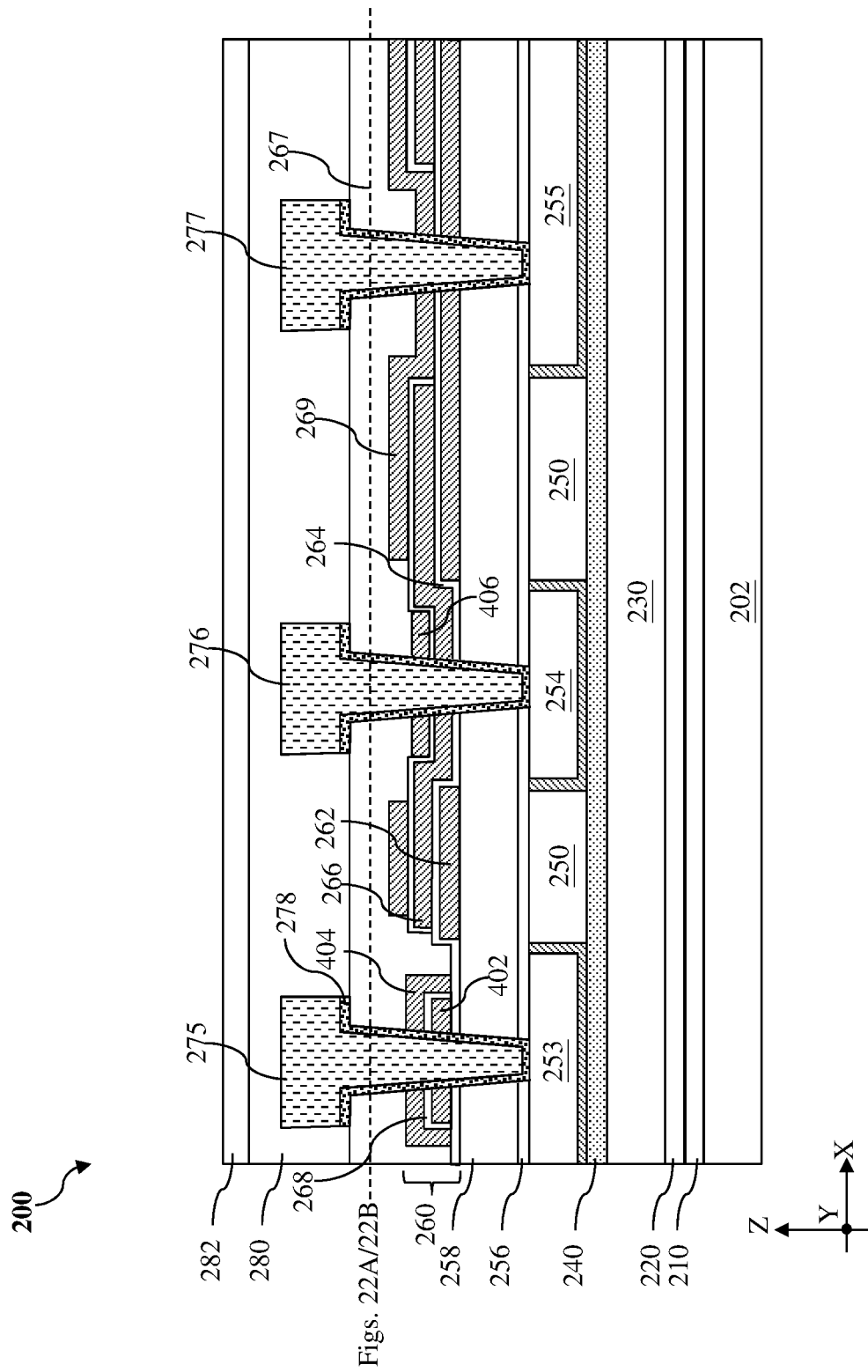

Referring to FIGS. 1 and 19, method 100 includes a block 28 where a passivation structure is formed over upper contact features 275, 276, and 277 and over the fourth dielectric layer 267. As shown in FIG. 18, a first passivation layer 280 is formed over the workpiece 200, including over the upper contact features 275, 276, and 277 and the fourth dielectric layer 267. In some embodiments, the first passivation layer 280 may include one or more plasma-enhanced oxide layers, one or more undoped silica glass layers, or a combination thereof. The first passivation layer 280 may be formed using CVD, spin-on coating, or other suitable technique. In some implementations, the first passivation layer 280 may be formed to a thickness between about 1000 nm and about 1400 nm, including 1200 nm. A second passivation layer 282 is formed over the first passivation layer 280. In some embodiments, the second passivation layer 282 may include silicon nitride (SiN) and may be formed by CVD, PVD or a suitable method to a thickness between about 600 nm and about 800 nm, including 700 nm.

Each of the upper contact features 275, 276 and 277 (including the barrier layer 278) in FIG. 19 may be substantially rectangular or substantially circular when viewed from the top. Reference is now made to FIGS. 22A and 22B, each of which is a cross section of one of the upper contact features 275, 276 and 277 (including the barrier layer 278) on the X-Y plane through the fourth dielectric layer 267. In some embodiments, each of the upper contact feature 275, 276 and 277 (including the barrier layer) is substantially rectangular as representatively shown in FIG. 22A. The rectangular cross-section in FIG. 22A has a first dimension L1 and a second dimension L2. In some instances, the first dimension L1 may be identical to the second dimension L2. In alternative instances, the first dimension L1 may be greater than the second dimension L2. In some implementations, the first dimension L1 and the second dimension L2 are between about 3200 nm and about 3800 nm. In some other embodiments, each of the upper contact features 275, 276 and 277 (including the barrier layer 278) is substantially circular as representative shown in FIG. 22B. The circular cross-section in FIG. 22B has a diameter R. In some implementations, the diameter R is between about 3200 nm and about 3800 nm.

Figure 20:
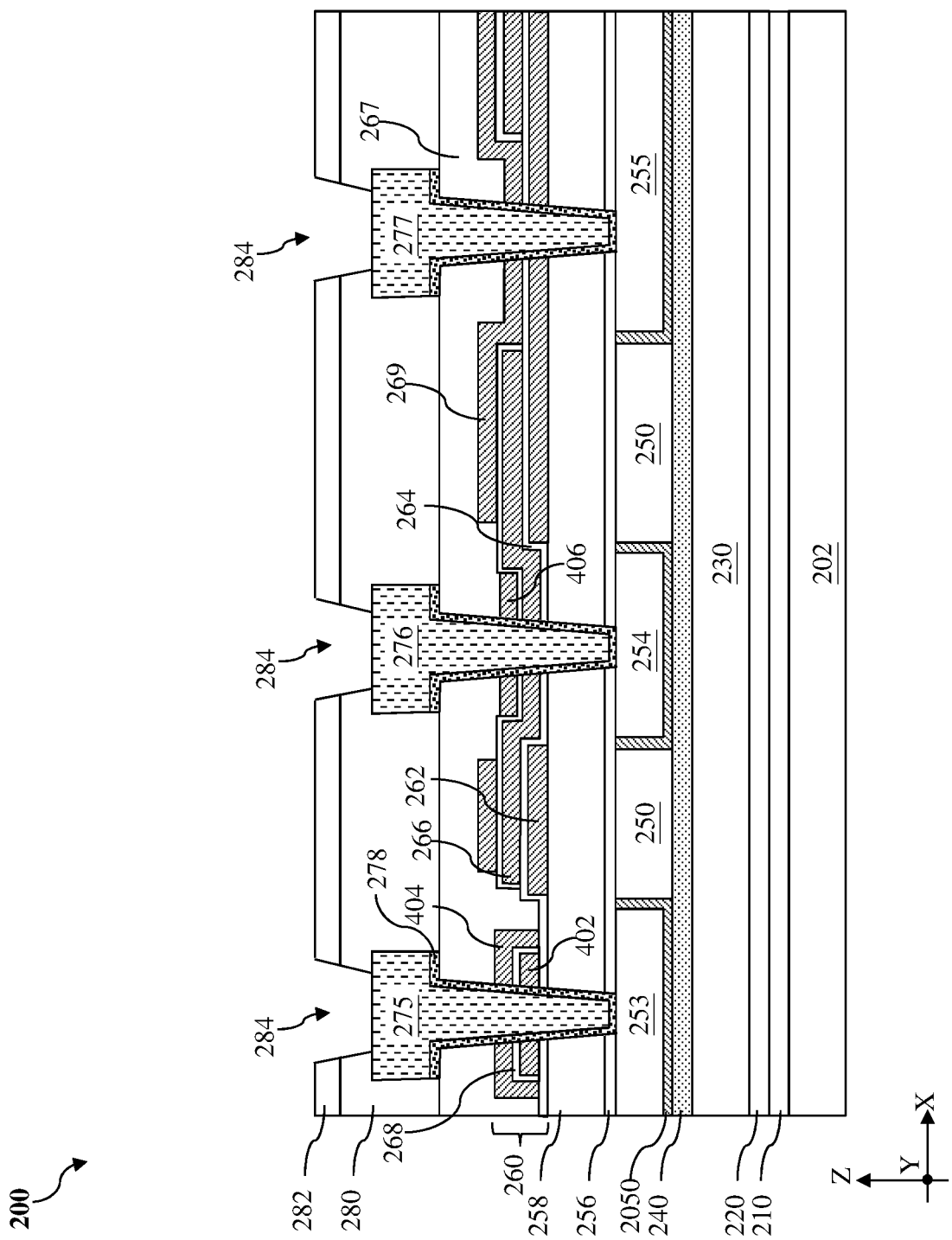

Referring to FIGS. 1 and 20, method 10 includes a block 30 where further processes may be performed. Such further processes may include formation of the openings 284 through the first passivation layer 280 and the second passivation layer 282, deposition of one or more polymeric material layers, patterning of the one or more polymeric material layers, deposition of an under-bump-metallurgy (or under-bump-metallization, UBM) layer, deposition of a copper-containing bump layer, deposition of a cap layer, deposition of a solder layer, and reflowing of the solder layer. These further processes form contact structures for connection to external circuitry.

Methods and semiconductor devices according to the present disclosure provide advantages. For example, methods of the present disclosure use fluorine-free etchant to etch through the MIM structure to prevent residual metal fluoride byproduct from being present at the interface between contact via and the MIM structure. The lack of metal fluoride residues results in improved contact resistance at said interface and improves device performance.

One aspect of the present disclosure involves a method. The method includes receiving a substrate including a lower contact feature, depositing a first dielectric layer over a substrate, forming a metal-insulator-metal (MIM) structure over the first dielectric layer, depositing a second dielectric layer over the MIM structure, performing a first etch process to form an opening that extends through the second dielectric layer to expose the MIM structure, performing a second etch process to extend the opening through the MIM structure to expose the first dielectric layer, and performing a third etch process to further extend the opening through the first dielectric layer to expose the lower contact feature. The first etch process includes a first etchant, the second etch process includes a second etchant, and the third etch process includes a third etchant. The first etchant and the third etchant include fluorine and the second etchant does not include fluorine.

In some embodiments, the MIM structure includes a conductor plate layer formed of titanium nitride, tantalum nitride, titanium, or tantalum. In some implementations, the MIM structure includes an insulator layer formed of zirconium oxide, hafnium oxide, aluminum oxide, tantalum oxide, silicon oxide, or titanium oxide. In some instances, the first etchant includes sulfur hexafluoride, the second etchant includes chlorine, the third etchant includes carbon tetrafluoride, and the lower contact feature includes copper.

Another aspect of the present disclosure involves a method. The method includes receiving a substrate including a lower contact feature, depositing a silicon nitride layer over a substrate, including over the lower contact feature, depositing a first silicon oxide layer over the silicon nitride layer, forming a conductor plate layer over the first silicon oxide layer, depositing a second silicon oxide layer over the conductor plate layer, performing a first etch process to form an opening through the second silicon oxide layer to expose the conductor plate layer, performing a second etch process to extend the opening through the conductor plate layer to expose the first silicon oxide layer, and performing a third etch process to further extend the opening through the first silicon oxide layer and the silicon nitride layer to expose the lower contact feature. The first etch process includes a first etchant, the second etch process includes a second etchant, and the third etch process includes a third etchant. The first etchant and the third etchant include fluorine and the second etchant consists essentially of chlorine.

In some embodiments, the conductor plate layer includes titanium nitride, tantalum nitride, titanium, or tantalum. In some implementations, the method further includes depositing an insulator layer over the conductor plate layer. The insulator layer is formed of zirconium oxide, hafnium oxide, aluminum oxide, tantalum oxide, silicon oxide, or titanium oxide. In some instances, the first etchant includes sulfur hexafluoride and the third etchant includes carbon tetrafluoride. In some implementations, the second etchant is selected such that no reaction between the second etchant and the conductor plate layer produces a non-volatile byproduct. In some embodiments, the opening penetrates the conductor plate layer with a linear taper. In some implementations, the method may further include forming a contact via through the opening to be in contact with the lower contact feature. In some instances, the contact via includes a barrier layer and a metal fill layer, the barrier layer and the conductor plate layer include the same composition, and the metal fill layer includes copper and aluminum.

Still another aspect of the present disclosure involves a semiconductor device. The semiconductor device includes a lower contact feature, a first dielectric layer over the lower contact feature, a metal-insulator-metal (MIM) structure over the first dielectric layer, a second dielectric layer over the MIM structure, and a contact via extending through the first dielectric layer, the MIM structure, and the second dielectric layer to be in direct contact with the lower contact feature. The contact via includes a first portion through a thickness of the first dielectric layer, a second portion through a thickness of the MIM structure, and a third portion through a thickness of the second dielectric layer. The first portion tapers substantially linearly at a first angle, the second portion tapers substantially linearly at a second angle greater than the first angle and the third portion tapers substantially linearly at a third angle smaller than the second angle.

In some embodiments, the MIM structure includes a conductor plate layer. The contact via includes a barrier layer and a metal fill layer embedded in the barrier layer. The barrier layer and the conductor plate include titanium, tantalum, titanium nitride, or tantalum nitride. The metal fill layer includes copper and aluminum. In some implementations, the MIM structure includes an insulator layer formed of zirconium oxide, hafnium oxide, aluminum oxide, tantalum oxide, silicon oxide, or titanium oxide. In some instances, an interface between the contact via and the MIM structure is free of metal fluoride. In some embodiments, the first angle is between about 0° and about 10°, the second angle is between about 35° and about 45°, and the third angle is between about 15° and about 20°.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving a substrate including a lower contact feature;
depositing a first dielectric layer over a substrate;
forming a metal-insulator-metal (MIM) structure over the first dielectric layer;
depositing a second dielectric layer over the MIM structure;
performing a first etch process to form an opening that extends through the second dielectric layer to expose the MIM structure;
performing a second etch process to extend the opening through the MIM structure to expose the first dielectric layer; and
performing a third etch process to further extend the opening through the first dielectric layer to expose the lower contact feature,
wherein the first etch process comprises a first etchant, the second etch process comprises a second etchant, and the third etch process comprises a third etchant,
wherein the first etchant and the third etchant comprise fluorine,
wherein the second etchant does not include fluorine.

2. The method of claim 1, wherein the MIM structure comprises a conductor plate layer formed of titanium nitride, tantalum nitride, titanium, or tantalum.

3. The method of claim 1, wherein the MIM structure comprises an insulator layer formed of zirconium oxide, hafnium oxide, aluminum oxide, tantalum oxide, silicon oxide, or titanium oxide.

4. The method of claim 1, wherein the first etchant comprises sulfur hexafluoride.

5. The method of claim 1, wherein the second etchant comprises chlorine.

6. The method of claim 1, wherein the third etchant comprises carbon tetrafluoride.

7. The method of claim 1, wherein the lower contact feature comprises copper.

8. A method, comprising:
receiving a substrate including a lower contact feature;

depositing a silicon nitride layer over a substrate, including over the lower contact feature;
depositing a first silicon oxide layer over the silicon nitride layer;
forming a conductor plate layer over the first silicon oxide layer;
depositing a second silicon oxide layer over the conductor plate layer;
performing a first etch process to form an opening through the second silicon oxide layer to expose the conductor plate layer;
performing a second etch process to extend the opening through the conductor plate layer to expose the first silicon oxide layer; and
performing a third etch process to further extend the opening through the first silicon oxide layer and the silicon nitride layer to expose the lower contact feature,
wherein the first etch process comprises a first etchant, the second etch process comprises a second etchant, and the third etch process comprises a third etchant,
wherein the first etchant and the third etchant comprise fluorine,
wherein the second etchant consists essentially of chlorine.

9. The method of claim 8, wherein the conductor plate layer comprises titanium nitride, tantalum nitride, titanium, or tantalum.

10. The method of claim 8, further comprising depositing an insulator layer over the conductor plate layer, wherein the insulator layer is formed of zirconium oxide, hafnium oxide, aluminum oxide, tantalum oxide, silicon oxide, or titanium oxide.

11. The method of claim 8,
wherein the first etchant comprises sulfur hexafluoride,
wherein the third etchant comprises carbon tetrafluoride.

12. The method of claim 8, wherein the second etchant is selected such that no reaction between the second etchant and the conductor plate layer produces a non-volatile byproduct.

13. The method of claim 8, wherein the opening penetrates the conductor plate layer with a linear taper.

14. The method of claim 8, further comprising:
forming a contact via through the opening to be in contact with the lower contact feature.

15. The method of claim 14,
wherein the contact via comprises a barrier layer and a metal fill layer,
wherein the barrier layer and the conductor plate layer comprise the same composition,
wherein the metal fill layer comprises copper and aluminum.

16. A semiconductor device, comprising:
a lower contact feature;
a first dielectric layer over the lower contact feature;
a metal-insulator-metal (MIM) structure over the first dielectric layer;
a second dielectric layer over the MIM structure; and
a contact via extending through the first dielectric layer, the MIM structure, and the second dielectric layer to be in direct contact with the lower contact feature, the contact via comprising a first portion through a thickness of the first dielectric layer, a second portion through a thickness of the MIM structure, and a third portion through a thickness of the second dielectric layer,
wherein the first portion tapers substantially linearly at a first angle,
wherein the second portion tapers substantially linearly at a second angle greater than the first angle,
wherein the third portion tapers substantially linearly at a third angle smaller than the second angle.

17. The semiconductor device of claim 16,
wherein the MIM structure comprises a conductor plate layer,
wherein the contact via comprises a barrier layer and a metal fill layer embedded in the barrier layer,
wherein the barrier layer and the conductor plate comprise titanium, tantalum, titanium nitride, or tantalum nitride,
wherein the metal fill layer comprises copper and aluminum.

18. The semiconductor device of claim 16, wherein the MIM structure comprises an insulator layer formed of zirconium oxide, hafnium oxide, aluminum oxide, tantalum oxide, silicon oxide, or titanium oxide.

19. The semiconductor device of claim 16, wherein an interface between the contact via and the MIM structure is free of metal fluoride.

20. The semiconductor device of claim 16,
wherein the first angle is between about 0° and about 10°,
wherein the second angle is between about 35° and about 45°
wherein the third angle is between about 15° and about 20°.

* * * * *